United States Patent [19]

Yamashita et al.

[11] Patent Number: 4,989,154
[45] Date of Patent: Jan. 29, 1991

[54] METHOD OF MEASURING RESISTIVITY, AND APPARATUS THEREFOR

[75] Inventors: Masato Yamashita, Hitachi; Hideo Enjyouji, Tokyo; Hiroshi Kurihara, Yokkaichi; Shoji Yamaguchi, Yokkaichi; Hideto Shimizu, Yokkaichi; Nichio Hashizume; Yasusuke Mori, both of Hiratsuka, all of Japan

[73] Assignee: Mitsubishi Petrochemical Company Ltd., Tokyo, Japan

[21] Appl. No.: 209,988

[22] Filed: Jun. 22, 1988

[30] Foreign Application Priority Data

Jul. 13, 1987 [JP] Japan .......................... 62-106344[U]
Aug. 19, 1987 [JP] Japan ................................ 62-204085
Jan. 19, 1988 [JP] Japan ................................ 63-4153[U]

[51] Int. Cl.$^5$ ............................................ G01R 27/00
[52] U.S. Cl. .................................. 364/482; 324/715; 324/719; 364/480; 364/550
[58] Field of Search ............ 324/62, 64, 73 R, 73 AT, 324/158 F, 158 R, 158 D, 65 P; 364/480, 481, 482, 488, 550, 551.01

[56] References Cited

U.S. PATENT DOCUMENTS

| | | | |
|---|---|---|---|
| 3,676,775 | 7/1972 | Dupnock et al. | 324/64 |
| 4,204,155 | 5/1980 | Terry | 324/64 |
| 4,267,506 | 5/1981 | Shiell | 324/64 |
| 4,335,350 | 6/1982 | Chen | 324/62 |
| 4,667,149 | 5/1987 | Cohen et al. | 324/64 |
| 4,703,252 | 10/1987 | Perloff et al. | 324/62 |
| 4,706,015 | 11/1987 | Chen | 324/64 |
| 4,755,746 | 7/1988 | Mallory et al. | 324/73 AT |
| 4,758,777 | 7/1988 | Bossard et al. | 324/64 |

FOREIGN PATENT DOCUMENTS 61-187466 11/1986 Japan .

OTHER PUBLICATIONS

The Potentials of Infinite Systems of Sources and Numerical Solutions of Problems in Semiconductor Engineering; A. Uhlir, Jr.; The Bell System Technical Journal, Jan. 1955; pp. 105–129.
Geometrical Correction Factor for Semiconductor Resistivity Measurements by Four-Point Probe Method: Yamashita et al., Japanese Journal of Applied Physics, vol. 23, No. 11, Nov. 1984, pp. 1499–1504.
Measurement of Sheet Resistivities with the Four-Point Probe: F. M. Smits; Bell System Technical Journal, May 1985; pp. 711–718.
The Geometric Factor in Semiconductor Four-Probe Resistivity Measurements; A. Mircea; Solid-State Electrodes, Pergamon Press, 1963; vol. 6, pp. 459–462.
Resistivity Measurements on Germanium for Transistors; L. B. Valdes; Proceedings of the IRE; 420–427; Feb. 1954.

*Primary Examiner*—Kevin J. Teska
*Attorney, Agent, or Firm*—Frishauf, Holtz, Goodman & Woodward

[57] ABSTRACT

A method and apparatus for measuring resistivity employ the four-point probe method to measure the surface resistivity or volume resistivity of a sample. The method includes inputting sample shape information and calculating a resistance correction coefficient for the sample based on the shape information and information relating to a measurement position on the sample. The sample surface resistivity or volume resistivity is calculated by multiplying a resistance value, which is measured in accordance with the four-point probe method, by the correction coefficient.

7 Claims, 20 Drawing Sheets

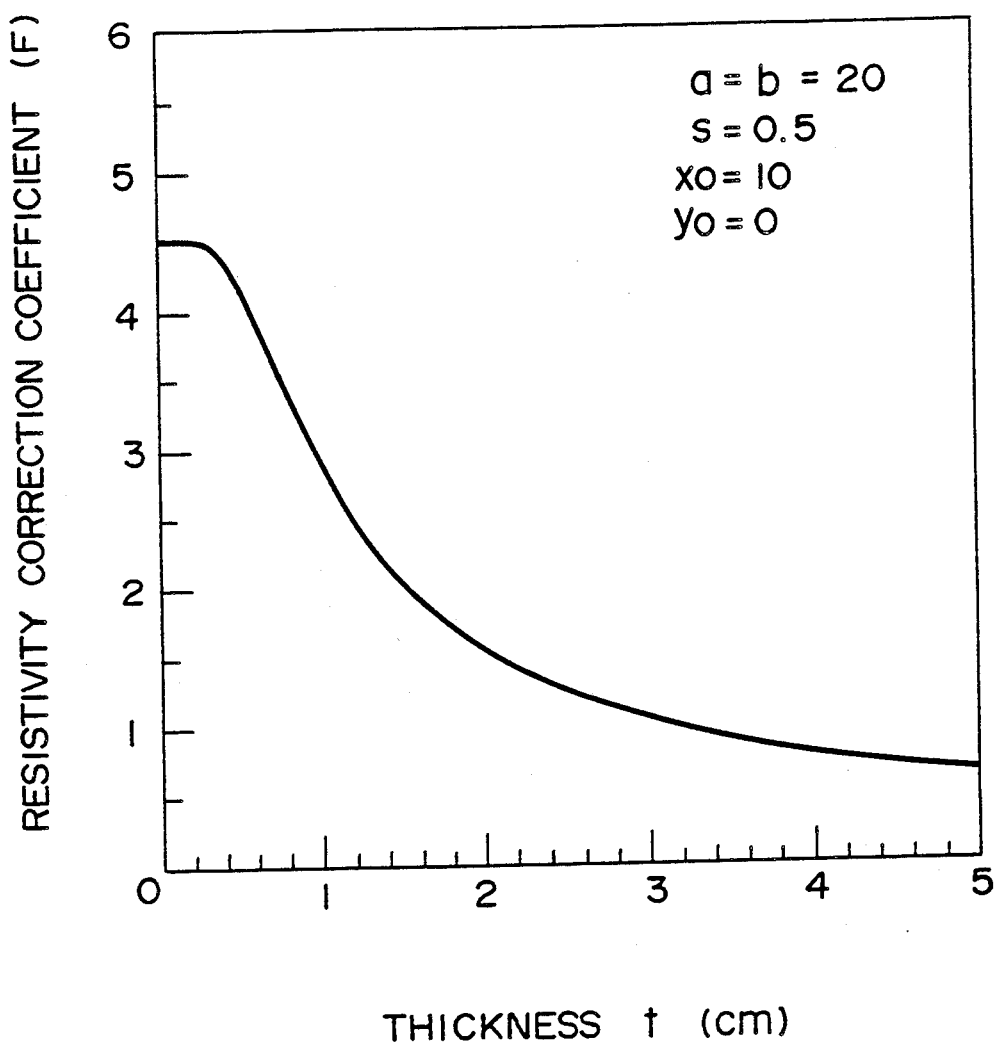
F I G. 3

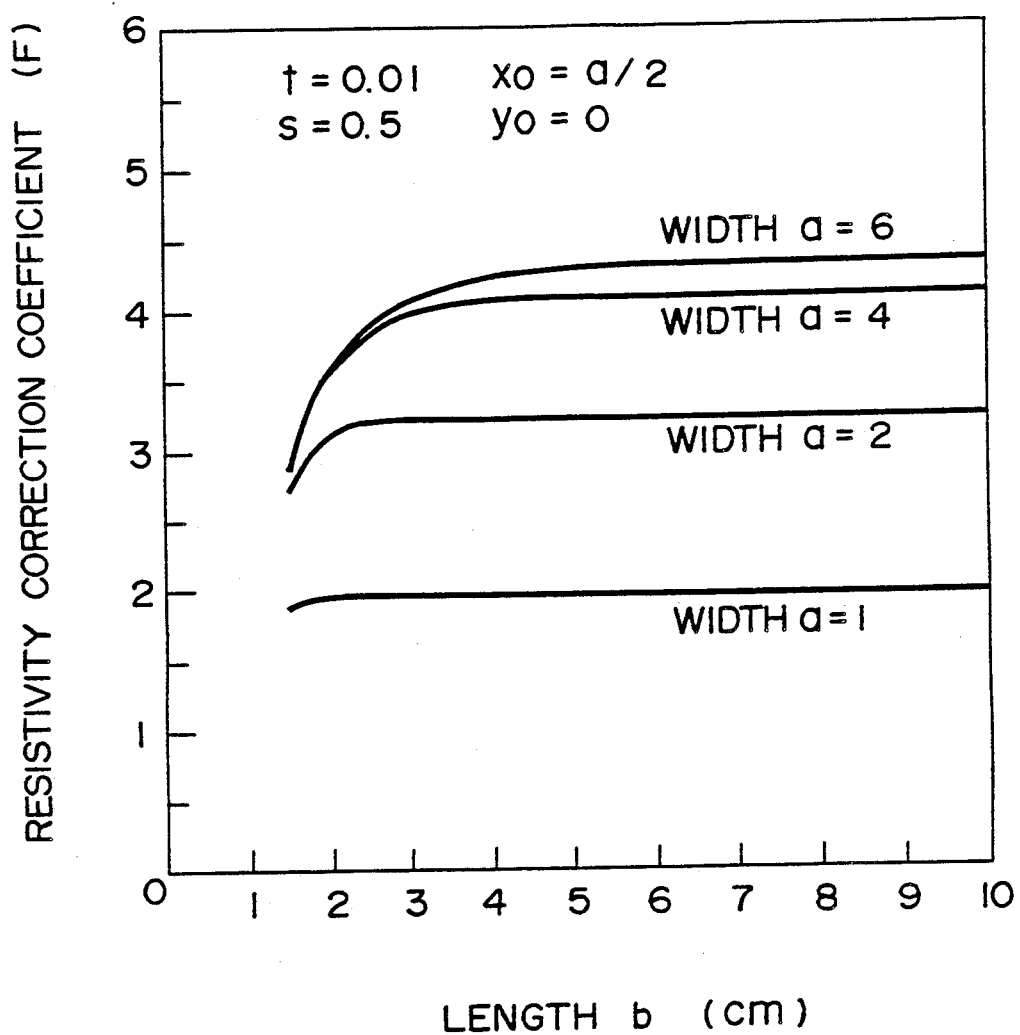
F I G. 4

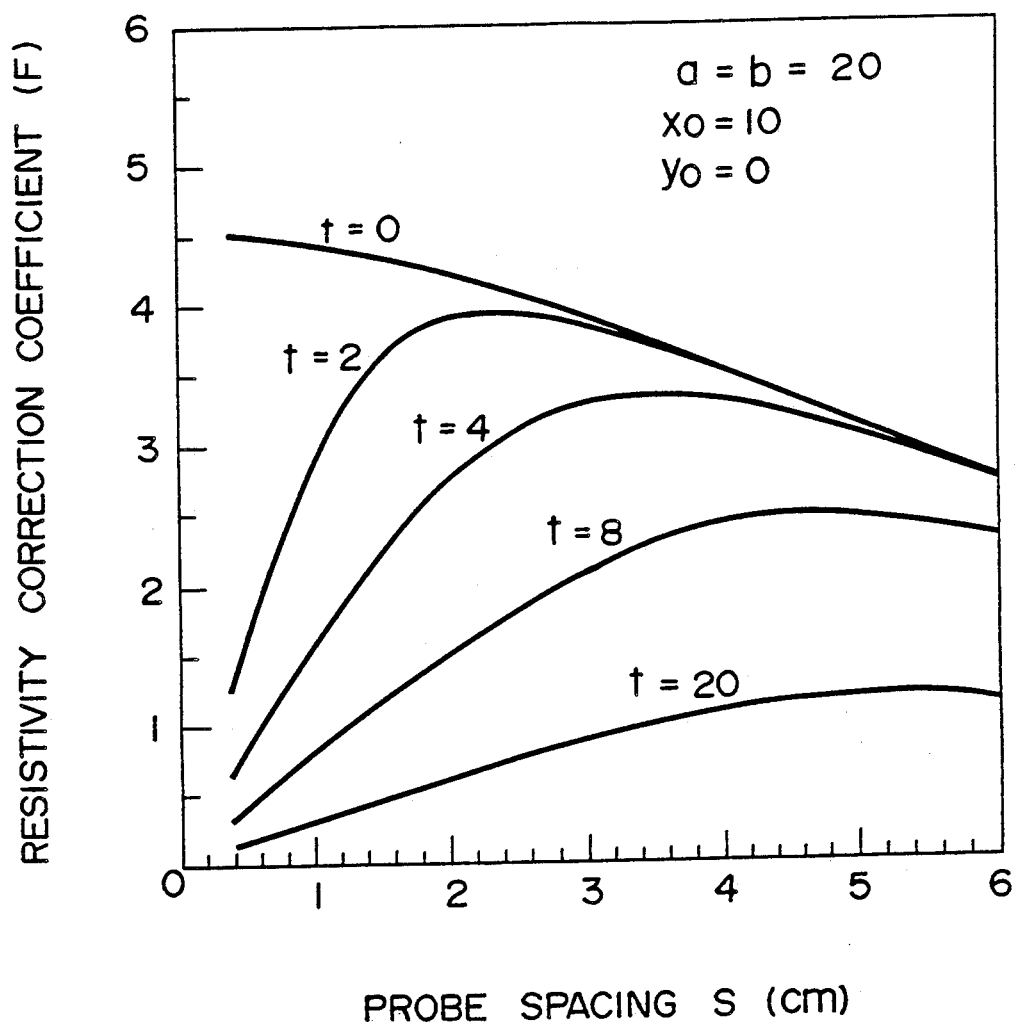
F I G. 5

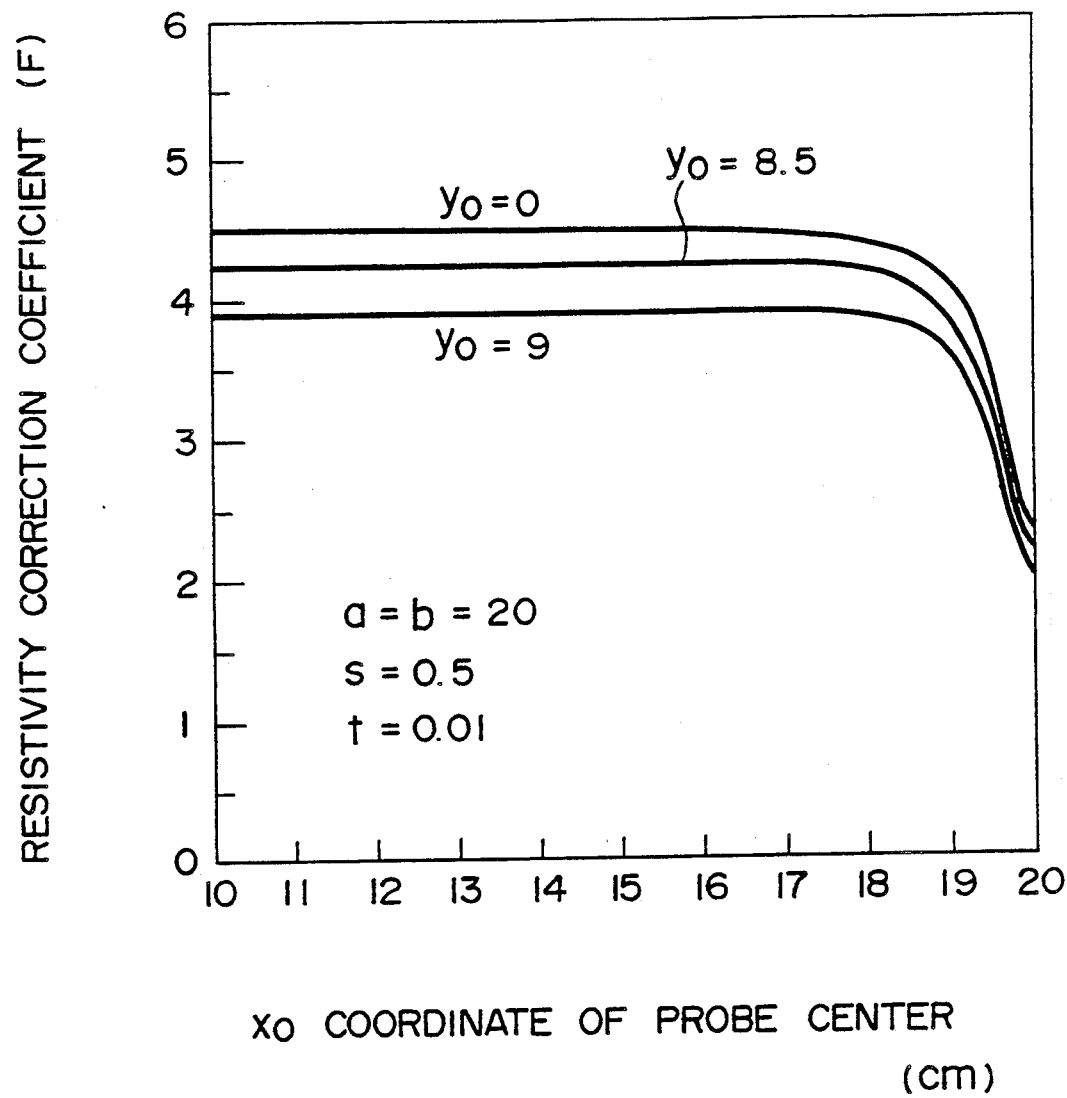
F I G. 6

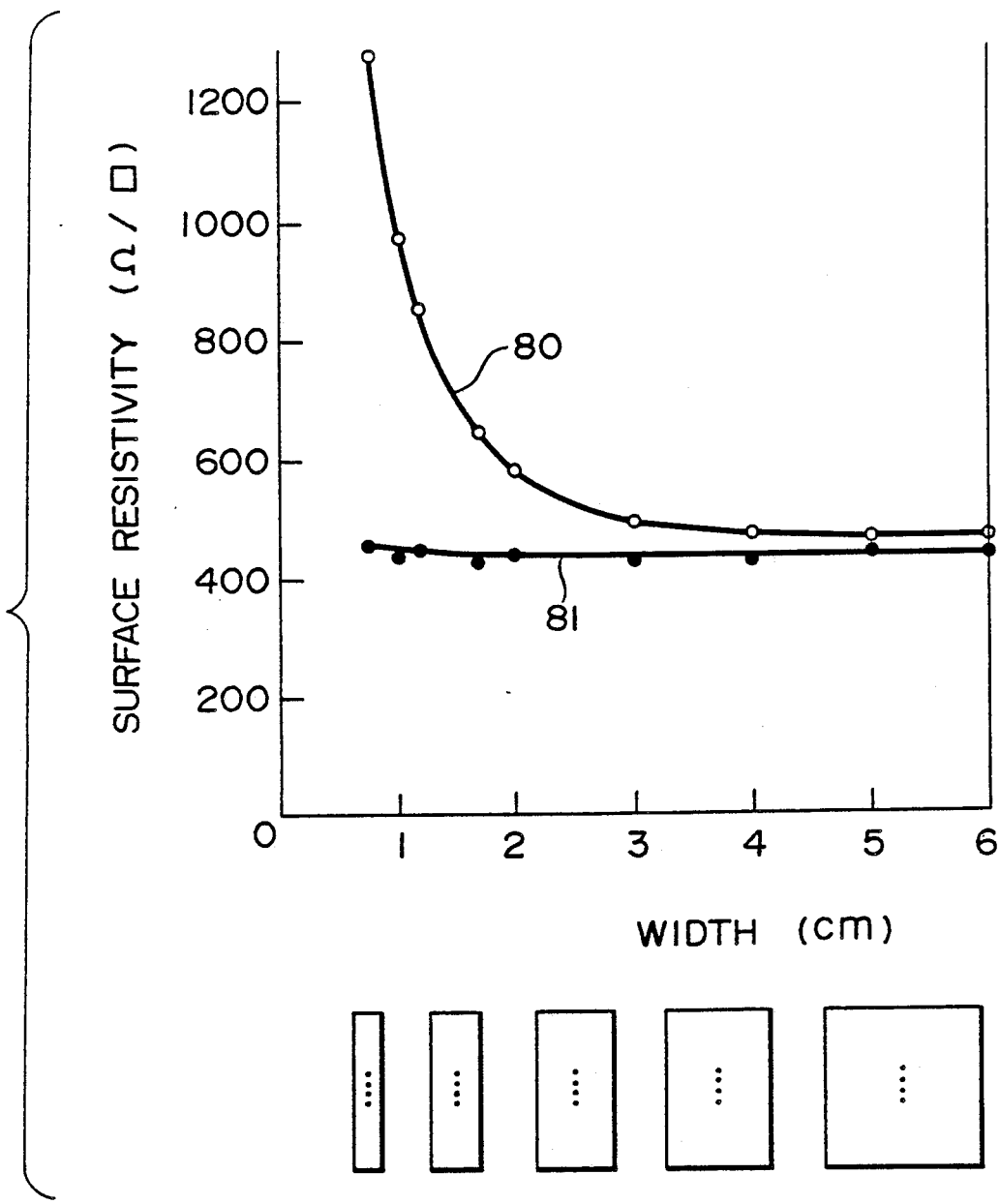
F I G. 8

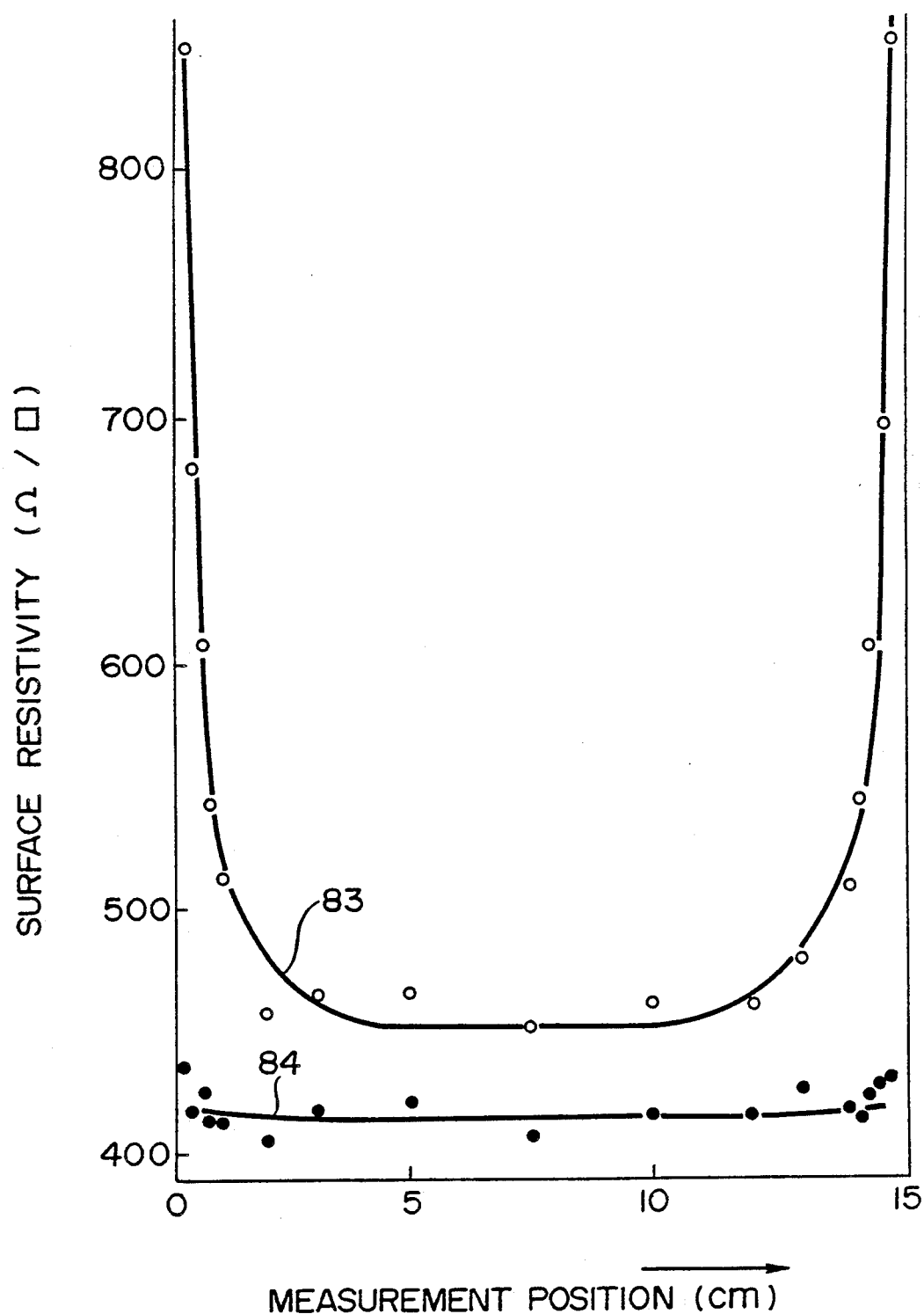
F I G. 9

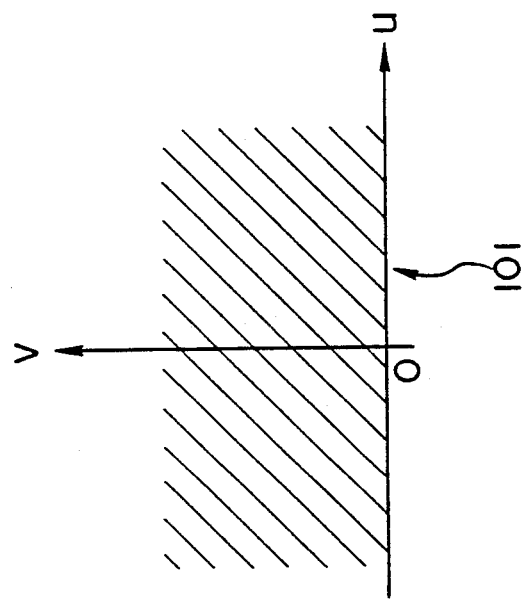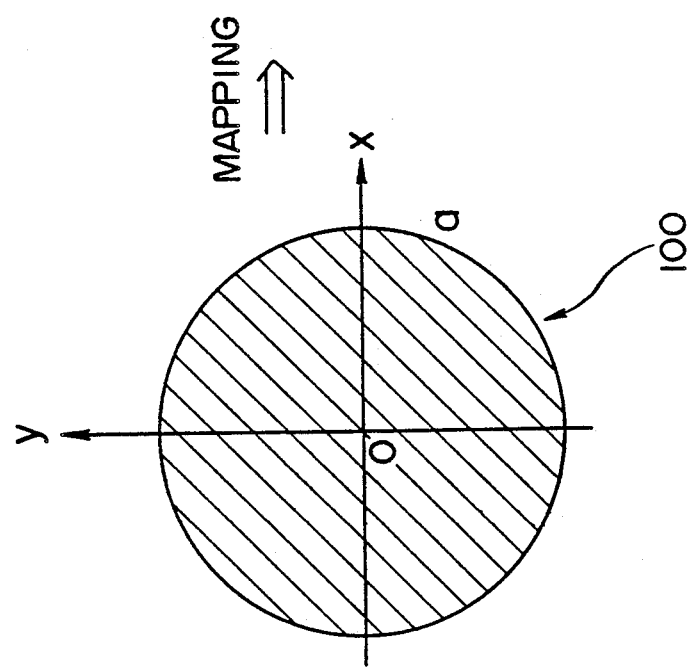
F I G. 10

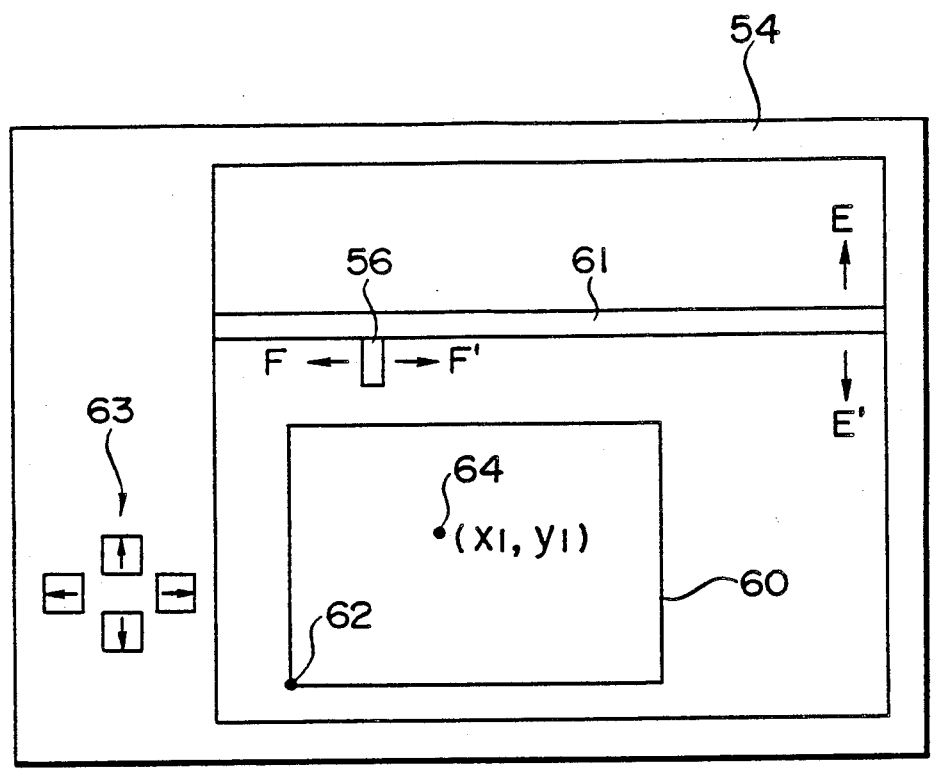
F I G. 13

METHOD OF MEASURING RESISTIVITY, AND APPARATUS THEREFOR

FIELD OF THE INVENTION

This invention relates to a method and apparatus for measuring resistivity, particularly such method and apparatus for measuring the surface resistivity or volume resistivity of a sample having a comparatively low resistivity, such as a conductive material or semiconductor material, by the four-point probe method.

BACKGROUND OF THE INVENTION

In general, the resistivity of a grown or diffused layer in a semiconductor, the resistivity of a metallic film produced by vapor deposition, or the resistivity of an electrically conductive film, is one important parameter which represents the electrical characteristics of these materials. In particular, surface resistivity, which is resistance per unit surface area, is often used as a measure of the conductive level of an electrically conductive polymeric material employed as a raw material for a conductive film. Here the surface resistivity is specified by the electrical resistance value between opposing sides of a unit square.

With regard to such measurement of surface resistivity of a conductive film, the applicant has previously filed a patent application (Japanese Utility Model application No. 60-71797, filed on May 14, 1985) on a simple surface resistivity measurement device capable of measuring the surface resistivity of a sample non-destructively in a simple and inexpensive manner.

In the simple surface resistivity measurement device according to this previously filed application, a holder is constructed of an electrical insulating material, and four spring-contact probes spaced apart a fixed distance are secured on the top surface of the holder. Contactors at the lower ends of these probes are urged by the elastic force of the springs so as to project slightly below the lower surface of both legs of the holder.

Since the simple surface resistivity measuring device is so constructed that the four spring-contact probes are thus provided on the holder consisting of an electrical insulator, the probes are brought into abutting contact with the sample at a fixed angle and pressure at all times by the elastic force of the springs, so that the surface resistivity of the sample can be measured accurately and non-destructively.

In general, when measuring surface resistivity, the contact resistance of electrodes contacting the sample or the resistance of the lead wires begins to appear with a two-terminal method if the surface resistivity measured is less than $10^2\Omega/\square$. When the surface resistivity is less than $10^0\Omega/\square$, accurate measurement cannot be expected unless the four-point probe method is employed.

FIG. 2 is a view illustrating a method of measuring surface resistivity by a two-point probe method according to the prior art. A current I is passed through both ends of a sample 25. Letting V represent the potential difference across the ends of the sample at this time, it will be understood that the resistance value R of the sample is given by V/I. Let the surface area of the sample 25 be represented by S (cm²), and let the length be l (cm). The volume resistivity $\rho_v$ ($\Omega\cdot$cm) will then be given by $\rho_v = R \times S/l$ ($\Omega\cdot$cm). If the sample 25 is an isotropic conductor, then the surface resistivity $\rho_S$ ($\Omega/\square$) and the volume resistivity $\rho_v$ ($\Omega\cdot$cm) will be related as follows:

$$\rho_S = \rho_v/t = R\cdot w/l \ (\Omega/\square)$$

where t (cm), w and l represents the thickness, width and length of the sample, respectively.

It should be noted that although the unit of surface resistivity is the ohm, this is expressed here as $\Omega/\square$ in terms of surface resistivity per unit square in order to distinguish it from a resistance value between any two points.

With the above-described two-terminal method, the contact resistance between the sample and the probes contributes to the electrical potential across the probes, and for this reason the surface resistivity of a sample having a comparatively low resistivity cannot be accurately determined. A measurement method for eliminating the contact resistance between a sample and a probe is the four-point probe method, which is now the method most widely used. According to this method, four probes arranged in a straight line are brought into contact with a sample, a current I is passed through the two outer probes, and the potential V across the two inner probes is measured. The volume resistivity $\rho_V$ of the sample is given by $\rho_V = F\cdot t\cdot V/I$, where t is the thickness of the sample. Here the coefficient F is dependent upon the shape and dimensions of the sample and the position of the probe array. Conventionally, this coefficient is decided based on the assumption that the sample has infinite area in comparison with the probe spacing, and it does not take the thickness of the sample into consideration. Consequently, large errors appear in the measured resistivity values of the sample depending upon the thickness, shape and size of the sample and the measurement positions.

In the method of measuring surface resistivity using the simple surface resistivity measuring device, the spring contact probes contact the sample at different contact pressures if the probes are brought into abutting contact with the sample in a state where the holder is tilted with respect to the sample. When the contact pressures differ, the area over which the tip of each contacts the sample differs from one probe to the next. As a result, if the angle of inclination of the holder differs when the operation for measuring the same sample is repeated, the measured value will differ each time.

Further, in the prior art, the sample to be measured is set while exposed to the atmosphere. This makes it very difficult to keep the sample at a predetermined temperature. As a consequence, it is almost impossible to measure the temperature dependence of the sample surface resistivity.

A method of measuring surface resistivity by the four-point probe method is illustrated in FIG. 20. The four-point probe is constructed by arranging four probes (electrodes) 40 through 43 equidistantly in a straight line. The probe array is placed on a sample, the voltage V produced across the two inner probes when a constant current is passed through the two outer probes is measured, and the surface resistivity is determined using a mathematical formula based on the voltage and current values, etc.

With this four-point probe, however, the spacing between adjacent probes cannot be made very small due to manufacturing limitations when the probe is fabricated. More specifically, owing to limitations imposed by a manual soldering operation for connecting the probes to their lead wires, it is difficult to make the spacing between electrodes (probes) less than about 1.5 mm. Accordingly, when the conventional probe arrangement is used, the distance between the two outer probes is about 5 mm, so that the entire four-point probe array cannot be placed on a sample whose length is less than 5 mm. This makes it impossible to measure the surface resistivity of such a sample.

SUMMARY OF THE INVENTION

Accordingly, an object of the present invention is to provide a method and apparatus for measuring resistivity, wherein the surface resistivity or volume resistivity of a sample can be accurately measured by determining a resistivity correction coefficient which takes into account the shape and thickness of the sample as well as the measurement positions.

Another object of the present invention is to provide a probe for a resistivity measuring device, wherein a sample is measured in a constant attitude at all times so that the same measurement results can be obtained when the same sample is measured repeatedly a number of times, this making it possible to improve the reliability of measured vales and to enable measurement of temperature dependence.

Still another object of the present invention is to provide a resistivity measuring apparatus capable of preventing destruction of a sample by limiting the value of applied current.

A further object of the present invention is to provide a resistivity measuring apparatus in which four probes need not be arranged in a straight line but which can, for example, be arranged in the form of a square, whereby the four probes can be accommodated in a small space to make possible the surface resistivity measurement even of small samples.

Yet another object of the present invention is to provide a measurement probe for a resistivity measuring device suitable for measuring smaller samples, this being made possible by arranging four probes in a smaller space rather than in a straight line.

According to a first aspect of the invention, an apparatus for measuring resistivity of a sample with a four-point probe, comprises input means for inputting (i) shape information including geometrical information specifying whether the sample is rectangular or circular, (ii) information specifying dimensions and thickness (t) of the sample, and (iii) information indicating a measurement position of the four-point probe on the sample; first calculating means or calculating a first correction coefficient for a rectangular sample based on the shape information and the measurement position information using a first equation obtained by Poisson's equation; second calculating means for calculating a second correction coefficient for a circular sample based on the shape information and the measurement position information using a second equation obtained by a method of images; resistance calculating means for calculating a resistance value from a predetermined value of a current (I) and a potential difference (V), by passing the predetermined current (I) through two outer electrodes of four electrodes of the four-point probe contacted on the sample, and detecting the potential difference (V) produced across two inner electrodes of said four electrodes of the four-point probe; resistivity calculating means for calculating surface resistivity of the sample using an equation $(F \times V/I)$, wherein the value F is the first or second correction coefficient; and output means for outputting at least one of the resistance value, the correction coefficients, and the surface resistivity.

According to a second aspect of the invention, a resistivity measurement apparatus for measuring the resistivity of a rectangular sample by bringing four electrodes into contact with the rectangular sample, comprises a measurement probe having two energizing electrodes for passing a current (I) through the sample, and two voltage measuring electrodes for measuring a surface potential difference (V) of the sample produced by the current (I), the energizing electrodes and the voltage measuring electrodes being arranged in a generally rectangular pattern; input means for inputting shape information specifying dimensions and thickness (t) of the rectangular sample, and measurement position information of the measurement probe on the sample; first calculating means for calculating a correction coefficient ($F_p$) of the sample based on the shape information and the measurement position information using a function obtained by Poisson's equation; second calculating means for calculating a resistance value (V/I) using the value of the current (I) and the surface potential difference (V); resistivity calculating means for calculating surface resistivity of the sample using the equation $(F_p \times V/I)$, or for calculating volume resistivity of the sample using an equation $(F_p \times t \times V/I)$; and output means for outputting at least one of the correction coefficient, the surface resistivity and the volume resistivity.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 3 is a graph showing the relationship between sample thickness and a resistivity correction coefficient;

FIG. 4 is a graph showing the relationship between sample length and a resistivity correction coefficient when sample width is taken as a parameter;

FIG. 5 is a graph showing the relationship between probe spacing and a resistivity correction coefficient when sample thickness is taken as a parameter;

FIG. 6 is a graph showing the relationship between the x coordinate of a probe array and a resistivity correction coefficient when the y coordinate of the center of the probe array is fixed and the probe array is moved along the x axis;

FIG. 8 is a view in which the relationship between the shape of a rectangular sample and the surface resistivity thereof is compared with a prior-art example;

FIG. 9 is a graph in which the relationship between measurement position and surface resistivity value when the measurement position is varied is compared with a prior-art example;

FIG. 10 is a view illustrating a mapping of a circular sample on a w plane;

FIG. 13 is a view showing the relationship between a sample and a probe on an X-Y table;

DESCRIPTION OF THE PREFERRED EMBODIMENTS

Preferred embodiments of the present invention will now be described in detail with reference to the accompanying drawings.

Figure 1:
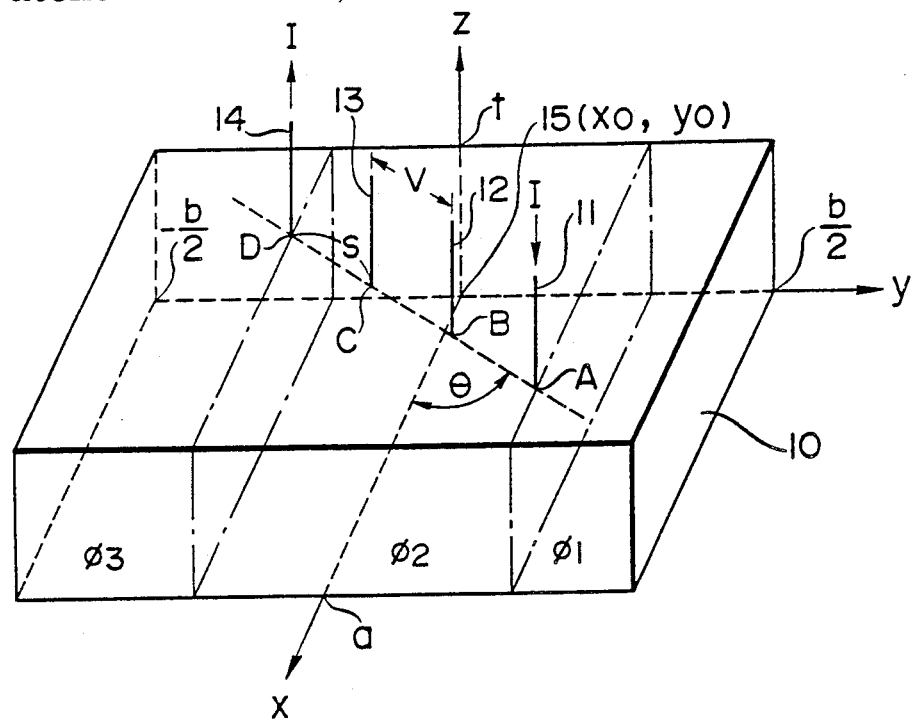
FIG. 1 is a view illustrating resistance measurement of a rectangular sample by a four-point probe method embodying the invention.
Figure 2:
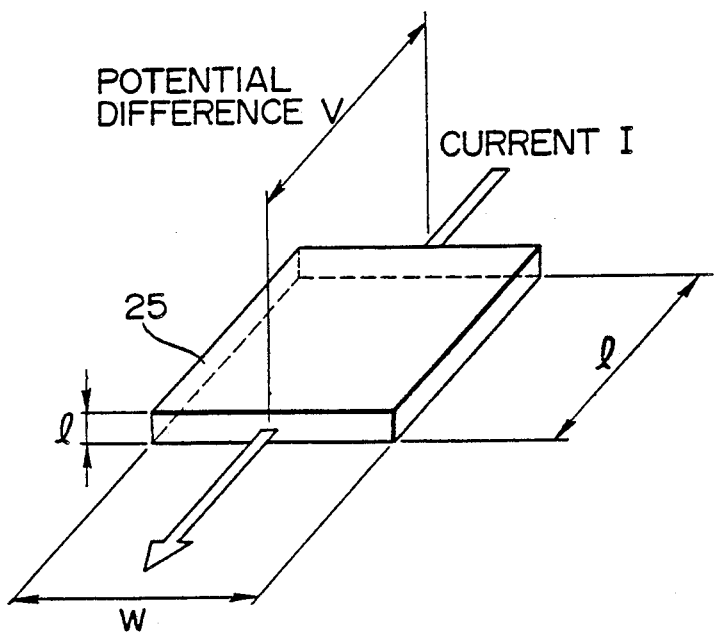
FIG. 2 is a view illustrating measurement of resistivity by a two-terminal method according to the prior art.

RESISTIVITY MEASUREMENT OF A RECTANGULAR SAMPLE BY THE FOUR-POINT PROBE METHOD (FIG. 1)

FIG. 1 is a view illustrating resistivity measurement of a rectangular sample 10 by the four-point probe method of the embodiment Numerals 11 through 14 denote probes linearly arranged, and A through D represent the points at which the respective probes 11-14 contact the surface of the sample 10. Numeral 15 denotes the center of the array of probes 11-14, the coordinates of the center being $(X_0, Y_0)$. The linear array of probes and the x axis define an angle $\theta$. A current I is passed through the outer probes 11, 14, and the potential difference across the inner probes 12, 13 is determined. The sample 10 has a length of a cm, a width of b cm and a thickness of t cm. If the coordinate axes x, y and z are set up as shown in FIG. 1, the coordinates (x,y,z) of the sample 10 will lie in the range $$0 \leq x \leq a, \frac{-b}{2} \leq y \leq \frac{b}{2}, 0 \leq z \leq t$$

In general, the potential $\phi$ at an arbitrary point in the sample 10 can be expressed as follows by Poisson's equation:

$$\nabla^2 \phi(\vec{r}) = -4\pi Q(\vec{r}) \tag{1}$$

where $Q(\vec{r})$ is the spatial distribution of charge, and $\vec{r}$ is a position vector.

The potential $\phi(\ )$ produced about the probe 11, which is the injection port of the current I, and about the probe 14, which is the current outflow port, is equal to the potential produced by a charge corresponding to the potential $Q(\vec{r})$ shown below.

$$Q(\vec{r}) = (\rho_v I/2\pi) \cdot [\delta(\vec{r}) - \vec{r}_A) - \delta(\vec{r} - \vec{r}_D)]$$

Accordingly, the potential $\phi(\vec{r})$ at any point in the sample 10 can be written as follows from Eq. (1):

$$\nabla^2 \phi(\vec{r}) = 2\rho_v \cdot I[\delta(\vec{r}) - (\vec{r}_D) - \delta(\vec{r}) - (\vec{r}_A)] \tag{2}$$

where $\rho_v$ is the resistivity of the sample, $\vec{r}_A$, $\vec{r}_D$ represent the position vectors of the coordinates $(x_A, y_A, t)$, $(x_D, y_D, t)$ of the probes 11, 14, respectively, and $\delta(\vec{r})$ represents a delta function.

Let the potentials of three regions in which the y coordinate is defined to lie in the ranges $y_A \leq y \leq b/2$, $y_D \leq y \leq y_A$, $-b/2 \leq y \leq y_D$ be represented by $\phi_1$, $\phi_2$ and $\phi_3$, respectively. Since the potentials must be equal owing to the respective electric fields, $\phi_2 = \phi_1$ will hold at $y = y_A$, and $\phi_2 = \phi_3$ will hold at $y = y_D$. Since the potentials at the respective boundaries must be smoothly connected, we have $$\left[\frac{\partial \phi_2}{\partial y}\right]_{y=y_A} - \left[\frac{\partial \phi_1}{\partial y}\right]_{y=y_A} = 2\rho I \cdot \delta(x - x_A) \cdot \delta(z - t) \tag{3}$$

Similarly, the expression at the position of the probe 14 is as follows:

$$\left[\frac{\partial \phi_2}{\partial y}\right]_{y=y_D} - \left[\frac{\partial \phi_3}{\partial y}\right]_{y=y_D} = 2\rho I \cdot \delta(x - x_D) \cdot \delta(z - t) \tag{4}$$

Since there is no flow of current to the outside from the surface of a region obtained by stacking another identical sample on the above-described sample, we have $$\text{grad } \phi(\vec{r})|_{(\text{surface})} = 0 \tag{5}$$

Solving Poisson's equation (2) under the foregoing conditions, we obtain the potentials $\phi_1$, $\phi_2$ and $\phi_3$ of the respective regions.

The potential $\phi_1(x,y,z)$ of any point in region 1 is as follows:

$$\phi_1(x,y,z) = B + (\rho_v I \cdot y_A/at) + \tag{6}$$

$$\sum_{m=1}^{\infty} \frac{2\rho_v I}{at \, \xi \sinh(b\xi)} \left\{ \cos(\xi x_A) \cosh\xi \left(y_A + \frac{b}{2}\right) - \cos(\xi x_D) \cosh\xi \left(y_D + \frac{b}{2}\right) \right\} \cos(\xi x) \cosh\xi \left(y - \frac{b}{2}\right) +$$

-continued $$\sum_{n=1}^{\infty} \frac{2(-1)^n \rho_v I}{at\eta\sinh(b\eta)} \left\{ \cosh\eta\left(y_A + \frac{b}{2}\right) - \cosh\eta\left(y_D + \frac{b}{2}\right) \right\} \times$$

$$\cosh\eta\xi\left(y - \frac{b}{2}\right)\cos(\eta z) +$$

$$\sum_{m=1}^{\infty}\sum_{n=1}^{\infty} \frac{4(-1)^n \rho_v I}{at\zeta\sinh(b\zeta)} \left\{ \cos(\xi\, x_A)\cosh\zeta\left(y_A + \frac{b}{2}\right) - \cos(\xi\, x_D)\cosh\zeta\left(y_D + \frac{b}{2}\right) \right\}\cos(\xi x)\cosh\zeta\left(y - \frac{b}{2}\right) \times \cos(\eta z)$$

where $$\xi = \frac{m\pi}{a},\ \eta = \frac{n\pi}{t},\ \zeta = (\xi^2 + \eta^2)^{\frac{1}{2}}$$

The potential $\phi_2(x,y,z)$ of any point in region 2 is as follows:

$$\phi_2(x,y,z) = B + \frac{\rho_v I \cdot y}{at} + \quad (7)$$

$$\sum_{m=1}^{\infty} \frac{2\rho_v \cdot I}{at\xi\sinh(b\xi)} \cos(\xi x) \left\{ \cos(\xi\, x_A)\cosh\xi\left(y_A - \frac{b}{2}\right) \times \right.$$

$$\cosh\xi\left(y + \frac{b}{2}\right) - \cos(\xi\, x_D)\cosh\xi\left(y_D + \frac{b}{2}\right) \times$$

$$\left. \cosh\xi\left(y - \frac{b}{2}\right) \right\} +$$

$$\sum_{n=1}^{\infty} \frac{2(-1)^n \rho_v \cdot I}{at\eta\sinh(b\eta)} \left\{ \cosh\eta\left(y_A - \frac{b}{2}\right)\cosh\eta\left(y + \frac{b}{2}\right) - \right.$$

$$\left. \cosh\eta\left(y_D + \frac{b}{2}\right)\cosh\eta\left(y - \frac{b}{2}\right) \right\}\cos(\eta z) +$$

$$\sum_{m=1}^{\infty}\sum_{n=1}^{\infty} \frac{4(-1)^n \rho_v \cdot I}{at\zeta\sinh(b\zeta)} \cdot \cos(\xi x) \times$$

$$\left\{ \cos(\xi\, x_A)\cosh\zeta\left(y_A - \frac{b}{2}\right)\cosh\zeta\left(y + \frac{b}{2}\right) - \right.$$

$$\left. \cos(\xi\, x_D)\cosh\zeta\left(y_D + \frac{b}{2}\right)\cosh\zeta\left(y - \frac{b}{2}\right) \right\}\cos(\eta z)$$

The potential $\phi_3(x,y,z)$ of any point in region 3 is as follows:

$$\phi_3(x,y,z) = B + \frac{\rho_v \cdot I \cdot y_D}{at} + \quad (8)$$

$$\sum_{m=1}^{\infty} \frac{2\rho_v \cdot I}{at\xi\sinh(b\xi)} \left\{ \cos(\xi\, x_A)\cosh\xi\left(y_A - \frac{b}{2}\right) - \cos(\xi\, x_D)\cosh\xi\left(y_D - \frac{b}{2}\right) \right\}\cos(\xi x)\cosh\xi\left(y + \frac{b}{2}\right) +$$

-continued $$\sum_{n=1}^{\infty} \frac{2(-1)^n \rho_v \cdot I}{at\eta\sinh(b\eta)} \left\{ \cosh\eta\left(y_A - \frac{b}{2}\right) - \cosh\eta\left(y_D - \frac{b}{2}\right) \right\} \times \cosh\eta\left(y + \frac{b}{2}\right)\cos(\eta z) +$$

$$\sum_{m=1}^{\infty}\sum_{n=1}^{\infty} \frac{4(-1)^n \rho_v \cdot I}{at\zeta\sinh(b\zeta)} \left\{ \cos(\xi\, x_A)\cosh\zeta\left(y_A - \frac{b}{2}\right) - \cos(\xi\, x_D)\cosh\zeta\left(y_D - \frac{b}{2}\right) \right\}\cos(\xi x)\cosh\zeta\left(y + \frac{b}{2}\right) \times \cos(\eta z)$$

The volume resistivity $\rho_V$ is written as follows:

$$\rho_V = F \frac{t}{I} V \quad (9)$$

Since V is the potential difference across the probes 12, 13, V is given by the following:

$$V = \phi(\vec{r}_B) - \phi(\vec{r}_C) \quad (10)$$
$$= \phi_2(x_B, y_B, t) - \phi_2(x_C, y_C, t)$$

Finding V on the basis of Eq. (7), we have $$V = \frac{\rho_v \cdot I}{at} \cdot (y_B - y_C) + \quad (11)$$

$$\sum_{m=1}^{\infty} \frac{2\rho_v \cdot I}{at\xi\sinh(b\xi)} \left[ \cos(\xi\, x_A)\cosh\xi\left(\frac{b}{2} - y_A\right) \times \right.$$

$$\left\{ \cos(\xi\, x_B)\cosh\xi\left(\frac{b}{2} + y_B\right) - \cos(\xi\, x_C)\cosh\xi\left(\frac{b}{2} + y_C\right) \right\} -$$

$$\cos(\zeta\, x_D)\cosh\xi\left(\frac{b}{2} + y_D\right)\left\{ \cos(\xi\, x_B)\cos\xi\left(\frac{b}{2} - y_B\right) - \right.$$

$$\left.\left. \cos(\xi\, x_C)\cos\xi\left(\frac{b}{2} - y_C\right) \right\} \right] + \sum_{n=1}^{\infty} \frac{2(-1)^n \rho_v \cdot I}{at \cdot \sinh(b\eta)} \cos(\eta z) \times$$

$$\cosh\eta\left(\frac{b}{2} - y_A\right)\left\{ \cos\eta\left(\frac{b}{2} + y_B\right) - \cosh\eta\left(\frac{b}{2} + y_C\right) \right\} -$$

$$\cosh\eta\left(\frac{b}{2} + y_D\right)\left\{ \cosh\eta\left(\frac{b}{2} - y_B\right) - \right.$$

$$\left. \cosh\eta\left(\frac{b}{2} - y_C\right) \right\} +$$

$$\sum_{m=1}^{\infty}\sum_{n=1}^{\infty} \frac{4(-1)^n \rho_v \cdot I}{at\zeta\sinh(b\zeta)} \cos(\eta z)\cos(\xi\, x_A) \times$$

$$\cosh\xi\left(\frac{b}{2} - y_A\right)\left\{ \cos(\xi\, x_B)\cosh\zeta\left(\frac{b}{2} + y_B\right) - \right.$$

$$\cos(\xi\, x_C)\cosh\zeta\left(\frac{b}{2} + y_C\right) \right\} - \cos(\xi\, x_D)\cosh\zeta\left(\frac{b}{2} + y_D\right) \times$$

-continued $$\left\{\cos(\xi\, x_B)\cosh\zeta\left(\frac{b}{2}-y_B\right)-\cos(\xi\, x_C)\cosh\zeta\left(\frac{b}{2}-y_C\right)\right\}$$

From Eqs. (9) and (11), we have $$F^{-1}=\frac{y_B-y_C}{a}+ \tag{12}$$

$$\sum_{m=1}^{\infty}\{G(\xi,x_A,x_B,x_C,y_A,y_B,y_C)-G(\xi,x_D,x_B,x_C,-y_D,-y_B,-y_C)\}+$$

$$\sum_{n=1}^{\infty}\{G(\eta,0,0,0,y_A,y_B,y_C)-G(\eta,0,0,0,-y_D,-y_B,y_C)\}+$$

$$\sum_{m=1}^{\infty}\sum_{n=1}^{\infty}2\,\{G(\zeta,x_A,x_B,x_C,y_A,y_B,y_C)-$$

$$G(\zeta,x_D,x_B,x_C,-y_D,-y_B,-y_C)\}$$

where $$G(\eta,x_A,x_B,x_C,y_A,y_B,y_C)=\frac{2}{a\eta\sinh(b\eta)}\cdot$$

$$\cos(\xi\, x_A)\cdot\cosh\eta\left(\frac{b}{2}-y_A\right)\times\left\{\cos(\xi\, x_B)\cosh\eta\left(\frac{b}{2}+y_B\right)-\right.$$

$$\left.\cos(\xi\, x_C)\cosh\eta\left(\frac{b}{2}+y_C\right)\right\}$$

When the width a, length b and thickness t of the sample and the coordinates $(x_0, y_0)$ of the center 15 of the probe array are inputted, the coordinates of each of the points A through D are determined based on the probe spacing S. Let $\theta$ be the angle defined by the line along which the probes are arrayed and one side of the sample. The coordinates of the points A through D are as follows:

$x_A = x_0 + 1.5 \times S \cos\theta$ $y_A = y_0 + 1.5 \times S \sin\theta$ $x_B = x_0 + 0.5 \times S \cos\theta$ $y_B = y_0 + 0.5 \times S \sin\theta$ $x_C = x_0 - 0.5 \times S \cos\theta$ $y_C = y_0 - 0.5 \times S \sin\theta$ $x_D = x_0 - 1.5 \times S \cos\theta$ $y_D = y_0 - 1.5 \times S \sin\theta$.

Letting r represent the radius of each of the probes 11 and 14, we have $x_A' = x_A - \{(3S - \sqrt{(3S)^2 - 4r^2})/2\} \cdot \cos\theta$ $y_A' = y_A - \{(3S - \sqrt{(3S)^2 - 4r^2})/2\} \cdot \sin\theta$ $x_D' = x_D + \{(3S - \sqrt{(3S)^2 - 4r^2})/2\} \cdot \cos\theta$ $y_D' = y_D + \{(3S - \sqrt{(3S)^2 - 4r^2})/2\} \cdot \sin\theta$ In the above, $x_A'$, $y_A'$, $x_D'$ and $y_D'$ are the coordinates of the equivalent current inflow and outflow points in a case where the contact radii of the probes 11 and 14 are taken into consideration.

Computation by $F^{-1}$ computer
Expanding Eq. (12) gives $$F^{-1}=\frac{y_B-y_C}{a}+\sum_{m=1}^{\infty}\frac{2}{a\,\xi\sinh(b\xi)}\cos(\xi\, x_A)\cos(\xi\, x_B)\times \tag{13}$$

$$\cosh\left[\xi\left(\frac{b}{2}-y_A\right)\right]\cosh\left[\xi\left(\frac{b}{2}+y_B\right)\right]-$$

$$\sum_{m=1}^{\infty}\frac{2}{a\,\xi\sinh(b\xi)}\cos(\xi\, x_A)\cos(\xi\, x_C)\times$$

$$\cosh\left[\xi\left(\frac{b}{2}-y_A\right)\right]\cosh\left[\xi\left(\frac{b}{2}+y_C\right)\right]-$$

$$\sum_{m=1}^{\infty}\frac{2}{a\,\xi\sinh(b\xi)}\cos(\xi\, x_B)\cos(\xi\, x_D)\times$$

$$\cosh\left[\xi\left(\frac{b}{2}-y_B\right)\right]\cosh\left[\xi\left(\frac{b}{2}+y_D\right)\right]+$$

$$\sum_{m=1}^{\infty}\frac{2}{a\,\xi\sinh(b\xi)}\cos(\xi\, x_C)\cos(\xi\, x_D)\times$$

$$\cosh\left[\xi\left(\frac{b}{2}-y_C\right)\right]\cosh\left[\xi\left(\frac{b}{2}+y_D\right)\right]+$$

$$\sum_{n=1}^{\infty}\frac{2}{a\,\eta\sinh(b\eta)}\times$$

$$\cosh\left[\eta\left(\frac{b}{2}-y_A\right)\right]\cosh\left[\eta\left(\frac{b}{2}+y_B\right)\right]-$$

$$\sum_{n=1}^{\infty}\frac{2}{a\,\eta\sinh(b\eta)}\times$$

$$\cosh\left[\eta\left(\frac{b}{2}-y_A\right)\right]\cosh\left[\eta\left(\frac{b}{2}+y_C\right)\right]-$$

$$\sum_{n=1}^{\infty}\frac{2}{a\,\eta\sinh(b\eta)}\times$$

$$\cosh\left[\eta\left(\frac{b}{2}-y_B\right)\right]\cosh\left[\eta\left(\frac{b}{2}+y_D\right)\right]+$$

$$\sum_{n=1}^{\infty}\frac{2}{a\,\eta\sinh(b\eta)}\times$$

$$\cosh\left[\eta\left(\frac{b}{2}-y_C\right)\right]\cosh\left[\eta\left(\frac{b}{2}+y_D\right)\right]+$$

$$\sum_{m=1}^{\infty}\sum_{n=1}^{\infty}\frac{4}{a\,\zeta\sinh(b\zeta)}\cos(\xi\, x_A)\cos(\xi\, x_B)\times$$

$$\cosh\left[\zeta\left(\frac{b}{2}-y_A\right)\right]\cosh\left[\zeta\left(\frac{b}{2}+y_B\right)\right]-$$

$$\sum_{m=1}^{\infty}\sum_{n=1}^{\infty}\frac{4}{a\,\zeta\sinh(b\zeta)}\cos(\xi\, x_A)\cos(\xi\, x_C)\times$$

-continued $$\cosh\left[\zeta\left(\frac{b}{2} - y_A\right)\right]\cosh\left[\zeta\left(\frac{b}{2} + y_C\right)\right] -$$

$$\sum_{m=1}^{\infty}\sum_{n=1}^{\infty} \frac{4}{a\,\zeta\,\sinh(b\zeta)} \cos(\xi\, x_B)\cos(\xi\, x_D) \times$$

$$\cosh\left[\zeta\left(\frac{b}{2} - y_B\right)\right]\cosh\left[\zeta\left(\frac{b}{2} + y_D\right)\right] +$$

$$\sum_{m=1}^{\infty}\sum_{n=1}^{\infty} \frac{4}{a\,\zeta\,\sinh(b\zeta)} \cos(\xi\, x_C)\cos(\xi\, x_D) \times$$

$$\cosh\left[\zeta\left(\frac{b}{2} - y_C\right)\right]\cosh\left[\zeta\left(\frac{b}{2} + y_D\right)\right]$$

The second term of Eq. (13) can be transformed as follows:

$$\sum_{m=1}^{\infty} \frac{2}{a\,\xi\,\sinh(b\xi)} \cos(\xi\, x_A)\cos(\xi\, x_B) \times \qquad (14)$$

$$\cosh\left[\xi\left(\frac{b}{2} - y_A\right)\right]\cosh\left[\xi\left(\frac{b}{2} + y_B\right)\right] =$$

$$\sum_{m=1}^{\infty} \frac{1}{a\,\xi(1 - e^{-2b\xi})} e^{-\xi(y_A - y_B)} \times \cos(\xi\, x_A)\cos(\xi\, x_B) +$$

$$\sum_{m=1}^{\infty} \frac{1}{a\,\xi(1 - e^{-2b\xi})} e^{-\xi(b + y_A + y_B)} \times \cos(\xi\, x_A)\cos(\xi\, x_B) +$$

$$\sum_{m=1}^{\infty} \frac{1}{a\,\xi(1 - e^{-2b\xi})} e^{-\xi(b - y_A - y_B)} \times \cos(\xi\, x_A)\cos(\xi\, x_B) +$$

$$\sum_{m=1}^{\infty} \frac{1}{a\,\xi(1 - e^{-2b\xi})} e^{-\xi(2b - y_A + y_B)} \times \cos(\xi\, x_A)\cos(\xi\, x_B)$$

Accordingly, a subroutine for determining Eq. (14) is prepared in advance, and the third term of Eq. (13) can be calculated by performing the substitutions $x_B \rightarrow x_C$, $y_B \rightarrow y_C$. Similarly, the fourth term of Eq. (13) is found by making the substitutions $x_A \rightarrow x_B$, $y_A \rightarrow y_B$, $x_B \rightarrow x_D$, $y_B \rightarrow y_D$, and the fifth term of Eq. (13) is found by making the substitutions $x_A \rightarrow x_C$, $y_A \rightarrow y_C$, $x_B \rightarrow x_D$, $y_B \rightarrow y_D$.

The sixth term of Eq. (13) is $$\sum_{n=1}^{\infty} \frac{2}{a\,\eta\,\sinh(b\eta)} \times \qquad (15)$$

$$\cosh\left[\eta\left(\frac{b}{2} - y_A\right)\right]\cosh\left[\eta\left(\frac{b}{2} + y_B\right)\right] =$$

$$\sum_{n=1}^{\infty} \frac{1}{a\,\eta(1 - e^{-2b\eta})} e^{-\eta(y_A - y_B)} +$$

$$\sum_{n=1}^{\infty} \frac{1}{a\,\eta(1 - e^{-2b\eta})} e^{-\eta(b + y_A + y_B)} +$$

$$\sum_{n=1}^{\infty} \frac{1}{a\,\eta(1 - e^{-2b\eta})} e^{-\eta(b - y_A - y_B)} +$$

$$\sum_{n=1}^{\infty} \frac{1}{a\,\eta(1 - e^{-2b\eta})} e^{-\eta(2b - y_A + y_B)}$$

A subroutine for determining Eq. (15) is prepared in advance, just as set forth. As a result, the seventh term of Eq. (13) will be obtained by making the substitution $y_B \rightarrow y_C$. The eighth term is obtained by making the substitutions $y_A \rightarrow x_B$, $y_B \rightarrow y_D$, and the ninth term can be obtained using the same subroutine by making the substitutions $y_A \rightarrow x_C$, $y_B \rightarrow y_D$.

The tenth term of Eq. (13) is expressed by the following equation:

$$\sum_{m=1}^{\infty}\sum_{n=1}^{\infty} \frac{4}{a\,\zeta\,\sinh(b\zeta)} \cos(\xi\, x_A)\cos(\xi\, x_B) \times \qquad (16)$$

$$\cosh\left[\zeta\left(\frac{b}{2} - y_A\right)\right]\cosh\left[\zeta\left(\frac{b}{2} + y_B\right)\right] =$$

$$\sum_{m=1}^{\infty}\sum_{n=1}^{\infty} \frac{2}{a\,\zeta(1 - e^{-2b\zeta})} e^{-\zeta(y_A - y_B)} \times \cos(\xi\, x_A)\cos(\xi\, x_B) +$$

$$\sum_{m=1}^{\infty}\sum_{n=1}^{\infty} \frac{2}{a\,\zeta(1 - e^{-2b\zeta})} e^{-\zeta(b + y_A + y_B)} \times$$

$$\cos(\xi\, x_A)\,\text{ocs}(\xi\, x_B) +$$

$$\sum_{m=1}^{\infty}\sum_{n=1}^{\infty} \frac{2}{a\,\zeta(1 - e^{-2b\zeta})} e^{-\zeta(b - y_A - y_B)} \times$$

$$\cos(\xi\, x_A)\cos(\xi\, x_B) +$$

$$\sum_{m=1}^{\infty}\sum_{n=1}^{28} \frac{2}{a\,\zeta(1 - e^{-2b\zeta})} e^{-\zeta(2b - y_A + y_B)} \times \cos(\xi\, x_A)\cos(\xi\, x_B)$$

The 11th through 14th terms of Eq. (13) are determined by using a computation subroutine for obtaining Eq. (16), and changing the variables of $x_A$, $y_B$, etc., as in the case described above.

In the computation subroutines of Eqs. (14) through (16), m and n are integers. When the computed terms become less than $10^{-10}$, the computations are terminated.

Thus, as described above, the reciprocal $F^{-1}$ of the correction coefficient of the rectangular sample is determined, and the correction coefficient F is obtained by the operation $1/F^{-1}$.

EXAMPLE OF COMPUTING RESISTIVITY CORRECTION COEFFICIENT (FIGS. 3–9)

FIG. 3 is a graph showing the relationship between the thickness of a sample and a resistivity correction coefficient (F) in a case where the length b and width a of the sample are both 20 cm and the position measured by a probe array in which the probe spacing is 0.5 cm is the center (10.0) of the sample (the probe array being arrayed parallel to one side of the sample). The point of intersection with the longitudinal axis corresponds to the correction coefficient for a sheet having no thickness. It has been confirmed that this correction coefficient accurately agrees with a correction coefficient of 4.5114 obtained by applying conformal mapping to a 20×20 cm² sheet In this example, the correction coefficient diminishes sharply from the vicinity where thickness exceeds 0.2 cm (about 40% of probe spacing S), and thereafter gradually approaches a constant value.

FIG. 4 is a graph showing showing the value of the correction coefficient when sample thickness is 0.01 cm, sample width a is a parameter, and sample length b is varied.

Probe spacing S and probe position are the same as in the case of FIG. 3. As width a increases, the length b at which the correction coefficient saturates also increases. The larger the area (a×b cm²) of the sample, the larger the correction coefficient. However, the correction coefficient becomes constant when the area exceeds a certain size.

FIG. 5 is a graph showing the correction coefficient whan thickness t is a parameter and probe spacing S is varied. Probe position is the same as in the case of FIG. 3.

If the sample is a sheet (t=0), the correction coefficient decreases monotonously with an increase in the probe spacing S. However, with regard to a sample having thickness, the correction coefficient becomes extremely large for a certain specific probe spacing. The probe spacing S for which the correction coefficient becomes very large increases as sample thickness t increases.

Figure 7:
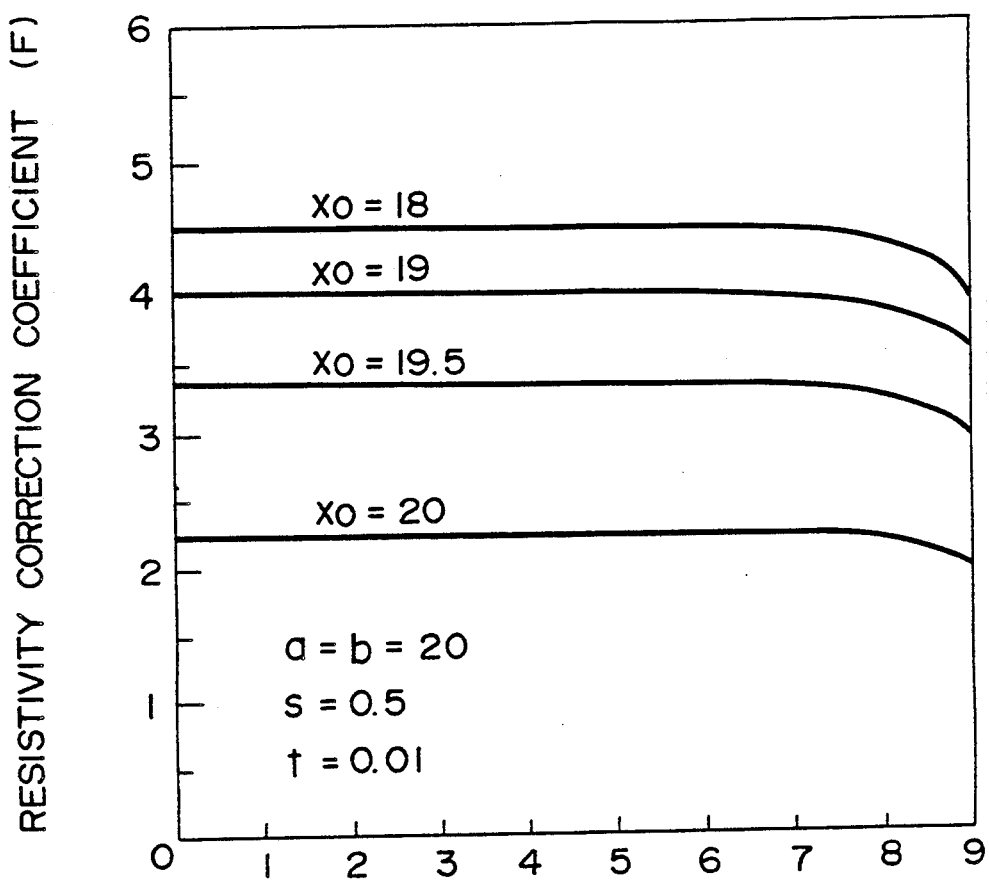
FIG. 7 is a graph showing the relationship between the y coordinate of a probe array and a resistivity correction coefficient when the x coordinate of the center of the probe array is fixed and the probe array is moved along the y axis.

FIGS. 6 and 7 are graphs showing the relationship between the center of the probe array and the resistivity correction coefficient when changing the measurement position of a square sample whose thickness is 0.01 cm and whose length and width are both 20 cm.

In FIG. 6, the y coordinate ($y_0$) of the center of the probe array is fixed and the probe is moved along the x axis. In FIG. 7, the x coordinate ($x_0$) of the center of the probe array is fixed and the probe is moved along the y axis. In either case, the probe array is moved while remaining parallel to the y axis.

It is clear from these graphs that the correction coefficient does not diminish unless the probe array is fairly close to an edge portion of the sample. The extent of diminution is greater when the probe array is moved parallel to the x axis (FIG. 6). The correction coefficient in an entire plane of the sample is obtained from the correction coefficient in one-fourth the plane.

FIGS. 8 and 9 are views illustrating an example in which measured values of resistivity using a correction coefficient calculated in the present embodiment are compared with the results of measurement obtained by a conventional method of measurement.

FIG. 8 shows the relationship between resistivity and width (cm) of a sample (ITO Film, manufactured by Teijin). Numeral 80 is a graphed curve indicating a resistivity value measured by a conventional method using a correction coefficient (about 4.532) in which it is assumed that sample width is infinite in comparison with probe spacing. Irrespective of the fact that the same sample is measured, the measured resistivity value increases when the width of the sample decreases Numeral 81 is a graphed curve indicating an example of measurement in a case where resistance value is corrected using a correction coefficient determined in accordance with the present embodiment. It will be appreciated that the measured resistivity value remains substantially constant even when sample width diminishes.

FIG. 9 likewise shows the relationship between the measurement position of a sample (width 15 cm) and the measured surface resistivity value of the sample. Curve 83 indicates the results of measurement performed by the conventional method, just as in the case of FIG. 8, and shows that the surface resistivity value increases sharply when the measurement position is near the edges of the sample. Curve 84 shows the results of a correction applied to the surface resistivity value using the correction coefficient of the present embodiment. Thus, in accordance with the present embodiment, surface resistivity can be measured highly accurately even when the measurement position is near an edge of the sample

RESISTIVITY MEASUREMENT OF CIRCULAR SAMPLE (FIGS. 10, 11)

Resistivity measurement of rectangular samples has been considered so far However, by using the four-point probe method, a correction coefficient for a circular sample can be determined as well in accordance with Poisson's equation based on the potential difference produced between the two inner probes in a manner similar to that described above. However, when the correction coefficient is obtained for a circular sample using this method, calculation of the correction coefficient in accordance with this method is impractical since a special function is contained in the coefficient. For this reason, the correction coefficient is calculated using a mapping method or method of images, described below.

The correction coefficient (F) of a circular sample having almost no thickness can be determined using a mapping method. In FIG. 10, numeral 100 denotes a circular sample as it appears on the z plane, and numeral 101 shows the sample mapped on a w plane. The mapping from the z plane to the w plane is expressed by $$w = i \frac{a - z}{a + z}$$

(where $a$ is the radius of the circular sample and $i = \sqrt{-1}$).

$$w = \frac{(a - x)i + y}{(a + x) + iy} = \frac{2ay + (a^2 - x^2 - y^2)i}{(a + x)^2 + y^2}$$

$$u = \frac{2ay}{(a + x)^2 + y^2}, \quad v = \frac{a^2 - x^2 - y^2}{(a + x)^2 + y^2}$$

Accordingly, if the positions of the probes 11–14 of the z plane are $(x_A, y_A)$, $(x_B, y_B)$, $(x_C, y_C)$, $(x_D, y_D)$, then the mapping of the probe 11 on the w plane will be expressed by $$u_A = \frac{2a \cdot y_A}{(a + x_A)^2 + y_A^2}, \quad v_A = \frac{a^2 - (x_A^2 + y_A^2)}{(a + x_A)^2 + y_A^2}$$

Obtaining the correction coefficient F from this, we have $$F = 2\pi/\ln\left(\frac{d_{BD} \cdot d_{BD'} \cdot d_{CA} \cdot d_{CA'}}{d_{BA} \cdot d_{BA'} \cdot d_{CD} \cdot d_{CD'}}\right) \tag{17}$$

where $d_{BD}$ is the distance between the mapped points of probe 12 (point B) and probe 14 (point D), and $d_{BD'}$ is the distance between the imaged points, with relation to the v axis, of the mapped point of probe 12 and the mapped point of probe 14. These distances are given by the following:

$$d_{BD} = \sqrt{(u_B - u_D)^2 + (v_B - v_D)^2}$$

$$d_{BD'} = \sqrt{(u_B - u_D)^2 + (v_B + v_D)^2}$$

Hereinafter, $d_{BA}$, $d_{CA}$, $d_{CD}$, $d_{BA'}$, $d_{CA'}$ and $d_{CD'}$ can be determined in similar fashion.

If Eq. (17) is used as is when sample thickness is not negligible, however, an accurate correction coefficient will not be obtained owing to the influence of thickness. Accordingly, a method of determining the correction coefficient of a sample by the method of images will be described next.

Figure 11:
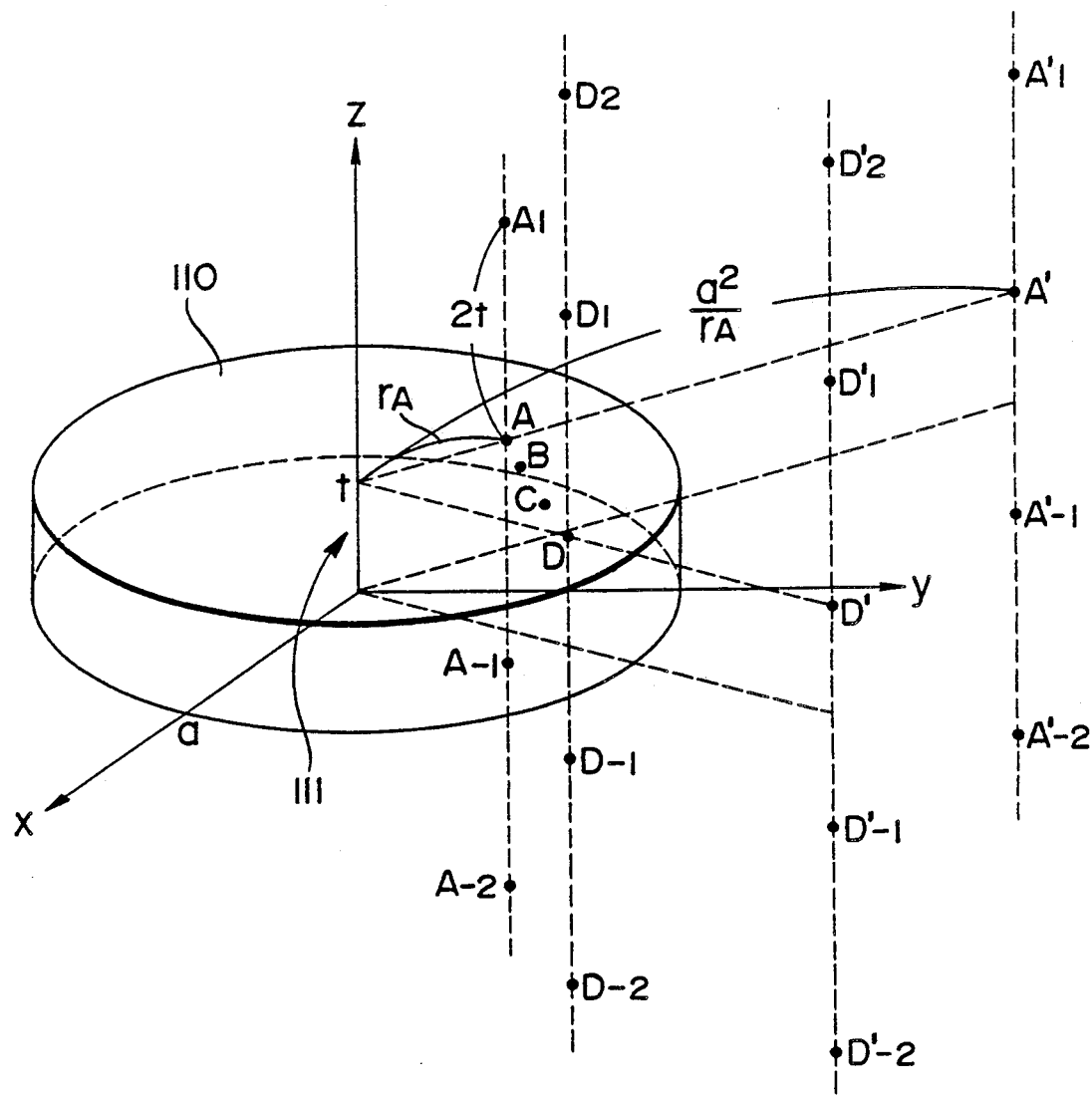
FIG. 11 is a view showing reflected points of points at which probes contact a circular specimen.

FIG. 11 is a view illustrating the principle of measurement by the method of images As in FIG. 1, A through D are the points at which the respective probes 11 through 14 contact the sample 110.

The sample 110 has a radius of a cm and a thickness of t cm. As in the case of FIG. 1, a current $I_{AB}$ is passed from probe 11 (point A) to probe 14 (point D), and the resistivity of the sample 110 is calculated based on the potential difference produced across the points B, C. Letting $r_A$ represent the length from the center 111 (0,0,t) of the sample 110 to point A, a reflected point A' is placed at a position spaced away from the center 111 by $a^2/r_A$ on a straight line connecting the center 111 and point A. The reflected points $A_1$, $A_{-1}$ of point A along the z axis lie on a straight line passing through the point A and perpendicular to the sample 110 The distance between the points A, $A_1$ is 2t. $A_{-1}$ is the mirror image of point $A_1$ with the point A as center. In this case points $A_1'$, $A_{-1}'$ corresponding to the abovementioned points $A_1$, $A_{-1}$ reside on a straight line passing through the point A' and lying parallel to the z axis.

Similarly, $D_1$, $D_{-1}$, $D'$, $D_1'$, $D_{-1}'$ are set with regard to the contact point (D) of probe 14.

The potentials at points B and C due to the equivalent charge $\rho_v I/2$ placed at these points are determined. The potential $V_B$ at point B is as follows:

$$V_B = \frac{\rho_v I}{2\pi} \left\{ \frac{1}{d_{AB}} + \frac{1}{d_{AB'}} - \frac{1}{d_{BD}} - \frac{1}{d_{BD'}} + f(d_{AB}) + f(d_{BA'}) - f(d_{BD}) - f(d_{BD'}) \right\} \quad (18)$$

and the potential $V_C$ at point C is $$V_C = \frac{\rho_v I}{2\pi} \left\{ \frac{1}{d_{AC}} + \frac{1}{d_{CA'}} - \frac{1}{d_{CD}} - \frac{1}{d_{CD'}} + f(d_{AC}) + f(d_{CA'}) - f(d_{CD'}) - f(d_{CD'}) \right\} \quad (19)$$

where the following holds:

$$f(x) = \sum_{n=1}^{\infty} \frac{2}{\sqrt{x^2 + (2nt)^2}} \quad (20)$$

Since the volume resistivity $\rho_v$ is $$\rho_v = F(t \cdot V/I) \quad (21)$$

we have $$V = V_B - V_C \quad (22)$$

and, from Eqs. (18), (19), (21) and (22), we have $$
\begin{aligned}
F^{-1} &= \frac{t \cdot V}{\rho_v \cdot I} \\
&= \frac{t}{2\pi} \left( \frac{1}{d_{AB}} + \frac{1}{d_{BA'}} - \frac{1}{d_{BD}} - \frac{1}{d_{BD'}} - \frac{1}{d_{AC}} - \frac{1}{d_{CA'}} + \frac{1}{d_{CD}} + \right. \\
&\quad \left. \frac{1}{d_{CD'}} + f(d_{AB}) + f(d_{BA'}) - f(d_{BD}) - f(d_{BD'}) - f(d_{AC}) - f(d_{CA'}) + f(d_{CD}) + f(d_{CD'}) \right)
\end{aligned}
\quad (23)
$$

By way of example, $d_{AB}$ indicates the distance between points A and B, and $d_{AB}$ is given by the following:

$$d_{AB} = \sqrt{(x_A - x_B)^2 + (y_A - y_B)^2}$$

where the coordinates of the point A through D are given by $(x_A, y_A, t)$, $(x_B, y_B, t)$, $(x_C, y_C, t)$ and $(x_D, y_D, t)$, respectively. Further, the coordinates of points A' and D' are $(x_{A'}, y_{A'}, t)$ and $(x_{D'}, y_{D'}, t)$, respectively. These are given by the following equations, respectively:

$$x_{A'} = a^2 \cdot x_A/(x_{A2} + y_{A2}) \quad (24)$$

$$y_{A'} = a^2 \cdot y_A/(x_{A2} + y_{A2})$$

$$x_{D'} = a^2 \cdot x_D/(x_{D2} + y_{D2})$$

$$y_{D'} = a^2 \cdot y_D/(x_{D2} + y_{D2})$$

Accordingly, Eq. (23) can be expanded as follows:

$$
\begin{aligned}
2\pi F^{-1} &= \frac{t}{[(x_A - x_B)^2 + (y_A - y_B)^2]^{\frac{1}{2}}} - \frac{t}{[(x_B - x_D)^2 + (y_B - y_D)^2]^{\frac{1}{2}}} - \\
&\quad \frac{t}{[(x_A - x_C)^2 + (y_A - y_C)^2]^{\frac{1}{2}}} + \frac{t}{[(x_C - x_D)^2 + (y_C - y_D)^2]^{\frac{1}{2}}} + \\
&\quad \frac{t}{[(x_{A'} - x_B)^2 + (y_{A'} - y_B)^2]^{\frac{1}{2}}} - \frac{t}{[(x_B - x_{D'})^2 + (y_B - y_{D'})^2]^{\frac{1}{2}}} - \\
&\quad \frac{t}{[(x_{A'} - x_C)^2 + (y_{A'} - y_C)^2]^{\frac{1}{2}}} - \frac{t}{[(x_C - x_{D'})^2 + (y_C - y_{D'})^2]^{\frac{1}{2}}} +
\end{aligned}
\quad (25)
$$

-continued $$\sum_{n=1}^{\infty} \frac{1}{\left[n^2 + \frac{(X_A - X_B)^2 + (y_A - y_B)^2}{4t^2}\right]^{\frac{1}{2}}} -$$

$$\sum_{n=1}^{\infty} \frac{1}{\left[n^2 + \frac{(X_A - X_C)^2 + (y_A - y_C)^2}{4t^2}\right]^{\frac{1}{2}}} -$$

$$\left(\sum_{n=1}^{\infty} \frac{1}{\left[n^2 + \frac{(X_B - X_D)^2 + (y_B - y_D)^2}{4t^2}\right]^{\frac{1}{2}}} - \sum_{n=1}^{\infty} \frac{1}{\left[n^2 + \frac{(X_C - X_D)^2 + (y_C - y_D)^2}{4t^2}\right]^{\frac{1}{2}}}\right) +$$

$$\sum_{n=1}^{\infty} \frac{1}{\left[n^2 + \frac{(X_{A'} - X_B)^2 + (y_{A'} - y_B)^2}{4t^2}\right]^{\frac{1}{2}}} -$$

$$\sum_{n=1}^{\infty} \frac{1}{\left[n^2 + \frac{(X_{A'} - X_C)^2 + (y_{A'} - y_C)^2}{4t^2}\right]^{\frac{1}{2}}} -$$

$$\left(\sum_{n=1}^{\infty} \frac{1}{\left[n^2 + \frac{(X_B - X_{D'})^2 + (y_B - y_{D'})^2}{4t^2}\right]^{\frac{1}{2}}} - \sum_{n=1}^{\infty} \frac{1}{\left[n^2 + \frac{(X_C - X_{D'})^2 + (y_C - y_{D'})^2}{4t^2}\right]^{\frac{1}{2}}}\right)$$

If Eq. (25) is evaluated by computer, calculation can be performed by changing the argument, as in the case of the rectangle, using the same subroutine (computation routine) from the first term to the eighth term. Also, in computing the infinite series of the ninth term onward, one computation routine can be prepared in the form of a subroutine, and computation can be readily carried out by giving each function as an argument, just as in the foregoing case.

In accordance with the computation routine for an infinite series in the present embodiment, computation is ended when the results of computation for n values becomes less than e.g. $10^{-9}$, at which time the total value (the value of $\Sigma$) is taken as the computed result of the term. It goes without saying that in the case of a circular sample, as in the case of the rectangular sample, computation is performed taking the radii of the probes 11 and 14 into consideration.

Eq. (25) is used when the thickness of the circular sample is greater than 0.02 cm. When the thickness is less than 0.02 cm, the correction coefficient is calculated in accordance with Eq. (17).

DESCRIPTION OF RESISTIVITY MEASUREMENT APPARATUS (FIGS. 12, 13)

Figure 12:
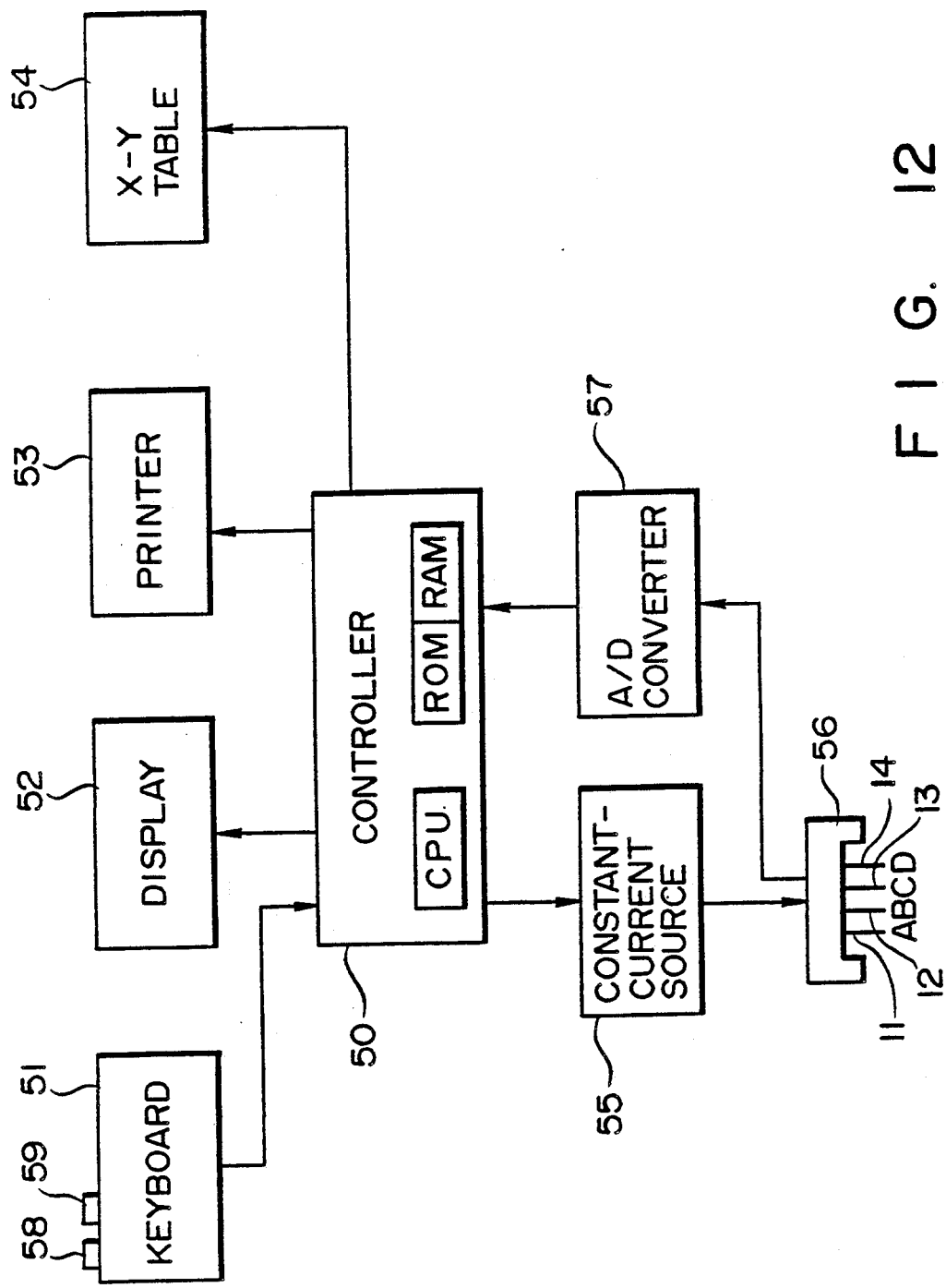
FIG. 12 is a block diagram illustrating the simplified construction of a resistivity measuring apparatus embodying the invention.

FIG. 12 is a block diagram illustrating the general construction of a resistivity measurement apparatus embodying the invention. The apparatus employs the measurement method described above.

The apparatus includes a keyboard 51 for inputting the shape, dimensions and measurement position of a sample to be measured, a display unit 52 for displaying the results obtained by computing the correction coefficient of the sample, as well as the surface resistivity and volume resistivity of the sample, a printer 53 for printing out the results obtained by measuring the sample, and an X-Y table 54 adapted to move a measurement probe array 56 on the sample so that measurement can be performed at any point on the sample.

The apparatus further includes a controller 50 for overall control of the apparatus. The controller 50 includes a CPU such as a microprocessor (8086, manufactured by Intel), an LSI (8087, manufactured by Intel) for various operations, a ROM storing the CPU control program and data, and a RAM serving as a working memory for temporarily preserving various data The controller 50 is adapted to compute the correction coefficient (F), surface resistivity and volume resistivity based on data such as the inputted shape (rectangular or circular), dimensions, etc , of the sample.

The apparatus is also provided with a constant-current source 55 for passing a constant current from the probe 11 to the probe 14 of the measurement probe array 56. A potential difference $V_{BD}$ produced across probes 12, 13 is inputted to an A/D converter 57, which converts the potential into a digital signal applied to the controller 50.

The operation of the apparatus will now be described in detail.

In measuring the resistivity of the sample, the first step is to compute the correction coefficient. To this end, the shape (circular or rectangular) of the sample is inputted from the keyboard 51. Lengths in the longitudinal and transverse directions are inputted in millimeter units when the sample is rectangular, and radius is inputted in millimeter units when the sample is circular. Next, the thickness of the sample in micron units is inputted from the keyboard 51.

The next step is to input the position on the sample at which measurement is to be taken. For the sake of simplification, the probe array is placed parallel to one side of the sample if the sample is rectangular or parallel to the y axis if the sample is circular The measurement position is midway between the probes 11, 14, and the coordinates of this position are inputted from the keyboard 51 in millimeter units. A plurality of measurement positions can be set for one sample. At this time the distance between probes also is inputted in millimeter units.

FIG. 13 is a view showing a case where the measurement position of a sample is set using the X-Y table 54.

In FIG. 13, numeral 60 denotes a rectangular sample, and numeral 62 designates the origin of the sample 60. When the coordinates $(x_1,y_1)$ of a measurement point 64 are inputted from the keyboard 51, a bar 61 and the probe array 56 are moved, whereby the center of the probe array is brought to the position $(x_1,y_1)$. The bar 61 is moved in the directions of arrows E, E' by a stepping motor or the like (not shown). The probe array 56 is secured to a belt or the like wound about a stepping motor (not shown) or the like, and is moved in the directions of arrows F, F'. When moved to the measurement position designated by the keyboard 51, the probe array 56 is lowered onto the sample 60 and is brought into contact with the sample 60 at a predetermined pressure.

The foregoing relates to a case where the probe array 56 is moved to a position corresponding to the measurement position inputted from the keyboard 51. However, it is also possible to perform measurement by moving the probe array 56 to an arbitrary position on the sample 60 by means of a cursor key 63 on the X-Y table 54. When the probe array 56 is thus moved to the desired position on the sample 60 by the cursor key 63, this position information is inputted to the controller 50 so that the measurement position can be designated without using the keyboard 51.

After the shape information, dimensions, thickness, measurement position and the like have thus been inputted, the start of calculation is instructed using the keyboard 51, whereupon the correction coefficient is calculated on the basis of sample shape, thickness and the like using the abovementioned equations, and the results of calculation are displayed on the display unit 52. On the basis of these results the surface resistivity $(\Omega/\square)$ and volume resistivity $(\Omega\cdot cm)$ of the sample are determined.

In FIG. 12, numeral 58 denotes a limit switch which protects the sample by limiting the current applied to the sample from constant-current source 55 to less than 10 V. Numeral 59 denotes a switch for setting a comparator function By using this switch, an upper limit or lower limit resistivity value of a comparator can be set. The arrangement is such that once this upper limit or lower limit resistance value has been set, an warning tone is produced as by a buzzer when the set resistivity value is above the upper limit or below the lower limit.

This setting function based on the setting of upper limit and lower limit values is convenient for situations where only those samples whose resistivity values fall within the stipulated range are extracted from among a large number of samples being tested on an assembly line or the like, by way of example.

DESCRIPTION OF PROCESSING FLOWCHART (FIGS. 14–16)

Figure 14A:
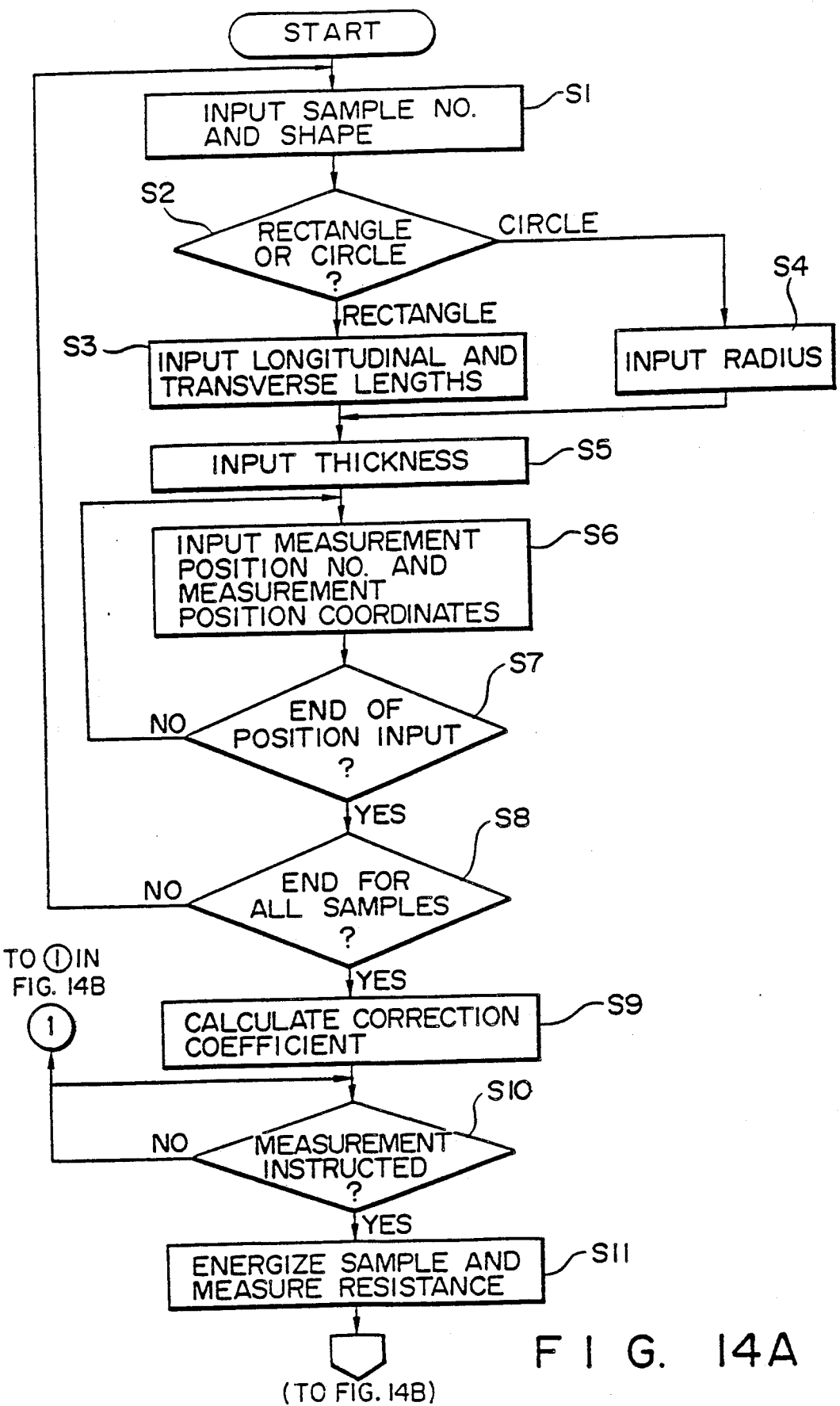
FIGS. 14A, 14B are flowcharts illustrating the operation of the resistivity measuring apparatus of the embodiment.
Figure 14B:
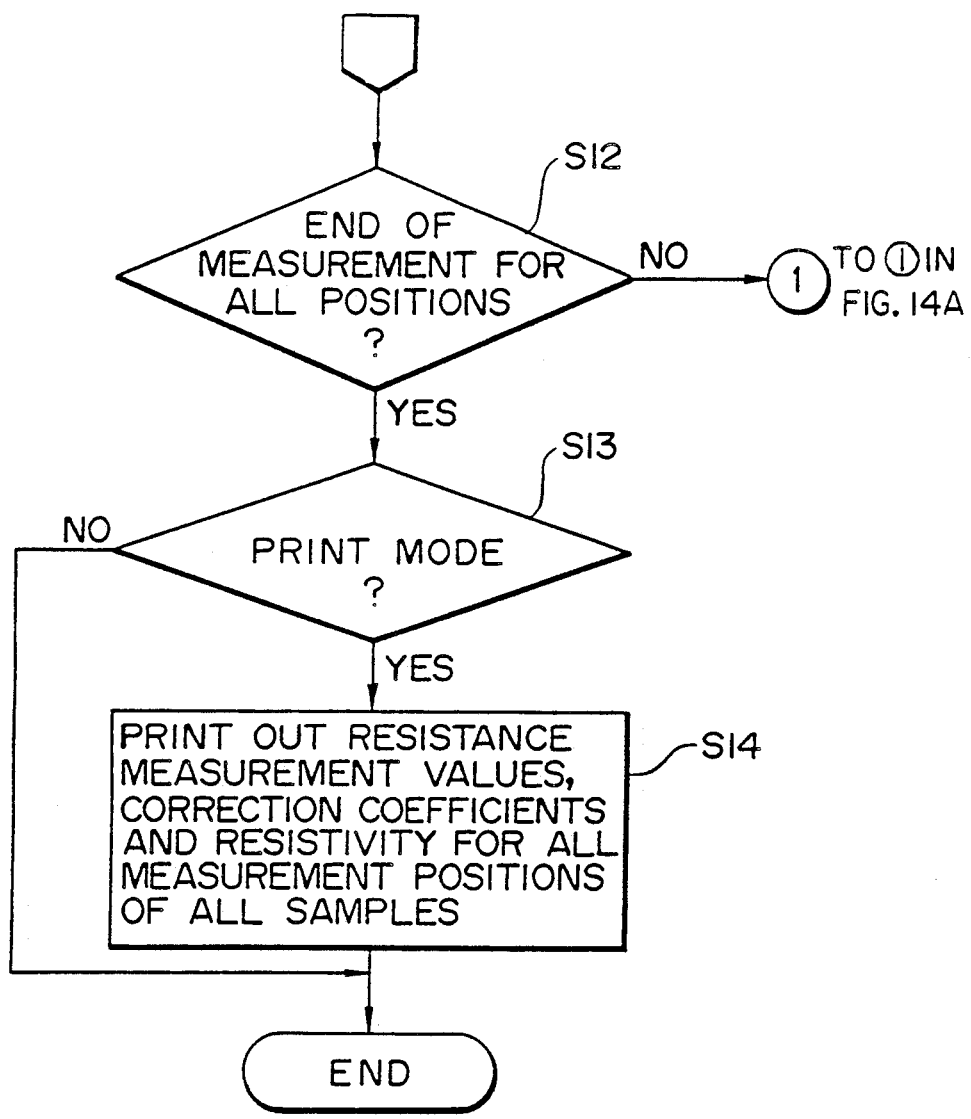

FIGS. 14A, 14B are flowcharts illustrating the processing performed by the resistivity measuring apparatus of the embodiment. The program is stored in the ROM of the controller.

Step S1 of the flowchart calls for input of the sample number and shape (rectangular or circular). Since the measured samples are either circular or rectangular, it is determined at a step S2 whether the sample shape is circular or rectangular. If the sample shape is rectangular, the longitudinal and transverse lengths thereof are inputted at a step S3. If the sample shape is circular, however, the program proceeds to a step S4, at which the radius of the sample is inputted in millimeter units. A step S5 calls for the thickness of the sample to be inputted is micron units. The number of a measurement position on the sample and the coordinates of the measurement position are inputted at a step S6.

Figure 15:
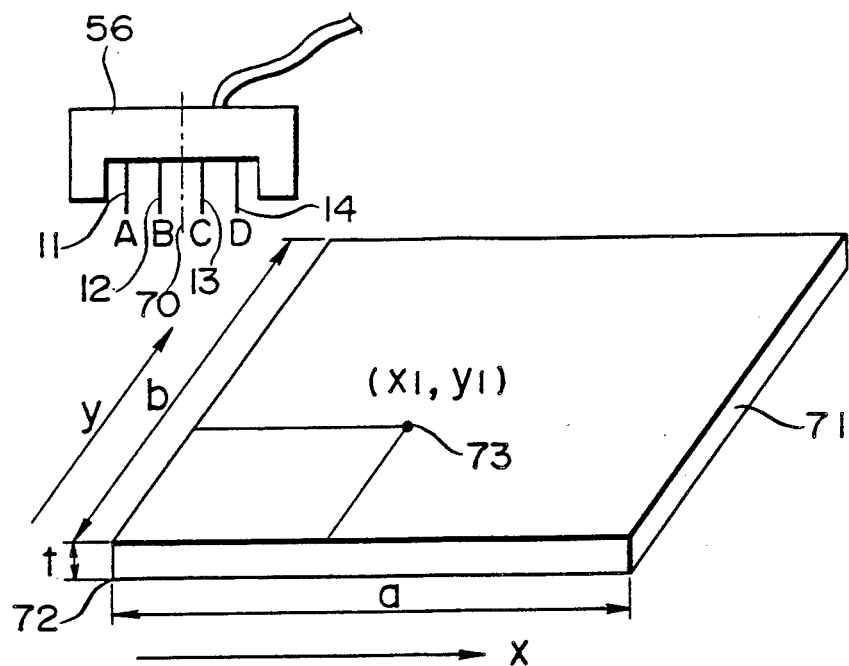
FIG. 15 is a view showing the relationship between the measurement position on a rectangular sample and a probe array.
Figure 16:
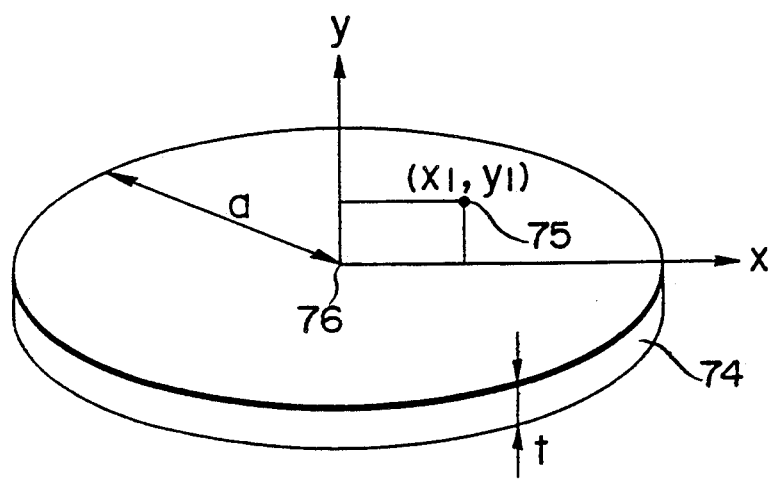
FIG. 16 is a view showing the relationship between the measurement position on a circular sample and a probe array.

FIGS. 15 and 16 are views showing the measurement positons of samples, in which FIG. 15 illustrates the coordinates for a rectangular sample and FIG. 16 the coordinates for a circular sample.

In FIG. 15, numeral 71 denotes the rectangular sample whose transverse direction is taken along the x axis and whose longitudinal direction is taken along the y axis. Let the length of the sample along the x axis, the length of the sample along the y axis and the thickness of the sample be a, b and t, respectively. Numeral 73 denotes the measurement point of the sample 71, the coordinates of this point being given by coordinates $(x_1,y_1)$, with the origin of the coordinate system being shown at 72. When measurement is performed at the point 73, the center 70 of the probe array 56 is placed at the position of point 73, and the probe array 56 is placed on the sample 71 in such a manner that the positions of the electrodes of the probe array lie parallel to the y axis.

FIG. 16 illustrates a circular sample 74 of thickness t and radius a. With a point 76 serving as the origin, the x axis is set to lie in the transverse direction, and the y axis is set to lie in the longitudinal direction. Numeral 75 denotes one measurement point on the circular sample 75, the coordinates of this point being given by $(x_1,y_1)$. At the time of measurement, the positions of the probe array 56 is so disposed that the probes 11, 12, 13 and 14 of the probe array 56 will lie parallel to the y axis, just as in the case of the rectangular sample.

Thus, in accordance with steps S1 through S6 of the flowchart of FIG. 14A, and in the case of the rectangular sample 71, the longitudinal and transverse lengths "b", "a" and the thickness "t" of the sample are inputted, and the x coordinates $x_1$ and y coordinate $y_1$ are inputted as the measurement position It is determined at a step S7 whether the entry of position has ended. The purpose of this step is to enable a plurality of measurement points to be designated on one sample. For example, when it is possible to designate ten points as measurement positions, the program will proceed to a step S8 in response to designation of the ten points. When the maximum designatable number of points (ten) for measurement is not designated, the program will proceed to the step S8 in response to a designation indicating that the entry of the measurement positions has been terminated. The step S8 calls for a determination as to whether the input of the aforementioned data relating to the next sample has been made. In this embodiment of the apparatus, a maximum of 20 samples can be designated for measurement.

When entry of shapes, dimensions and the like of all samples desired to be measured ends, correction coefficients for all measurement points on all of the samples are calculated at displayed on the display unit 52 at a step S9. The calculation of correction coefficient can be performed using the aforementioned mathematical formulae based on sample shape, thickness, etc.

Next, the center 70 of the probe array 56 is placed at the measurement position of the sample. In the case of a rectangular sample, the probe array 56 is placed parallel to one side of the sample. In the case of the circular sample shown in FIG. 16, the center 70 of the probe array 56 is placed at the measurement position and the probes 11, 12, 13 and 14 are placed parallel to the y axis. When an input designating the start of measurement is made at a step S10, the program proceeds to a step S11, at which the current I is passed through the probes 11 (A) and 14 (D) from the constant-current source 55 and a digital signal indicative of the potential difference V produced across the probes 12, 13 is inputted to the controller 50, this digital signal being obtained by the conversion performed by the A/D converter 57.

The surface resistivity $\rho_S$ of the sample is obtained in accordance with the equation $$\rho_S = F \cdot \frac{V}{I} \ (\Omega/\square)$$

based on V and I.

The volume resistivity $\rho_V$ is calculated in accordance with the equation $$\rho_V = t \cdot \rho_S (\Omega \cdot cm)$$

and is displayed on the display unit 53. The character t represents the thickness of the sample.

The results of calculation are stored in the RAM of controller 50 simultaneously. Next, it is determined at a step S12 (FIG. 14B) whether measurements at all measurement positions of all samples have been completed. If the answer is NO, the program returns to the step S10 and the system waits for change of the measurement point and for the instruction designating the start of measurement, after which the foregoing operations from step S10 onward are executed.

It is determined at a step S13 whether a print instruction has been entered from the keyboard 51 calling for the printer 53 to print out the correction coefficient, the measured resistance value and the like. When such an instruction is entered from the keyboard, the program proceeds to a step S14, at which the measured surface resistivities, the volume resistivities and the correction coefficients for all measurement points of all samples are printed out.

In the present embodiment, the correction coefficient is computed at the step S9. However, if the correction coefficient is known beforehand, the correction coefficient can be inputted directly from the keyboard or the like.

When samples are exchanged and the next sample is measured, the correction coefficient of the preceding sample can be utilized if the correction coefficient of the new sample exchanged for this preceding sample has not been decided. Accordingly, when resistance measurement is performed at an identical measurement point on a sample having an identical shape, the correction coefficient need be calculated only once.

Thus, in accordance with the embodiment described hereinabove, the surface resistivity and volume resistivity of a sample can be measured accurately regardless of the shape of the sample and the measurement position.

Figure 17:
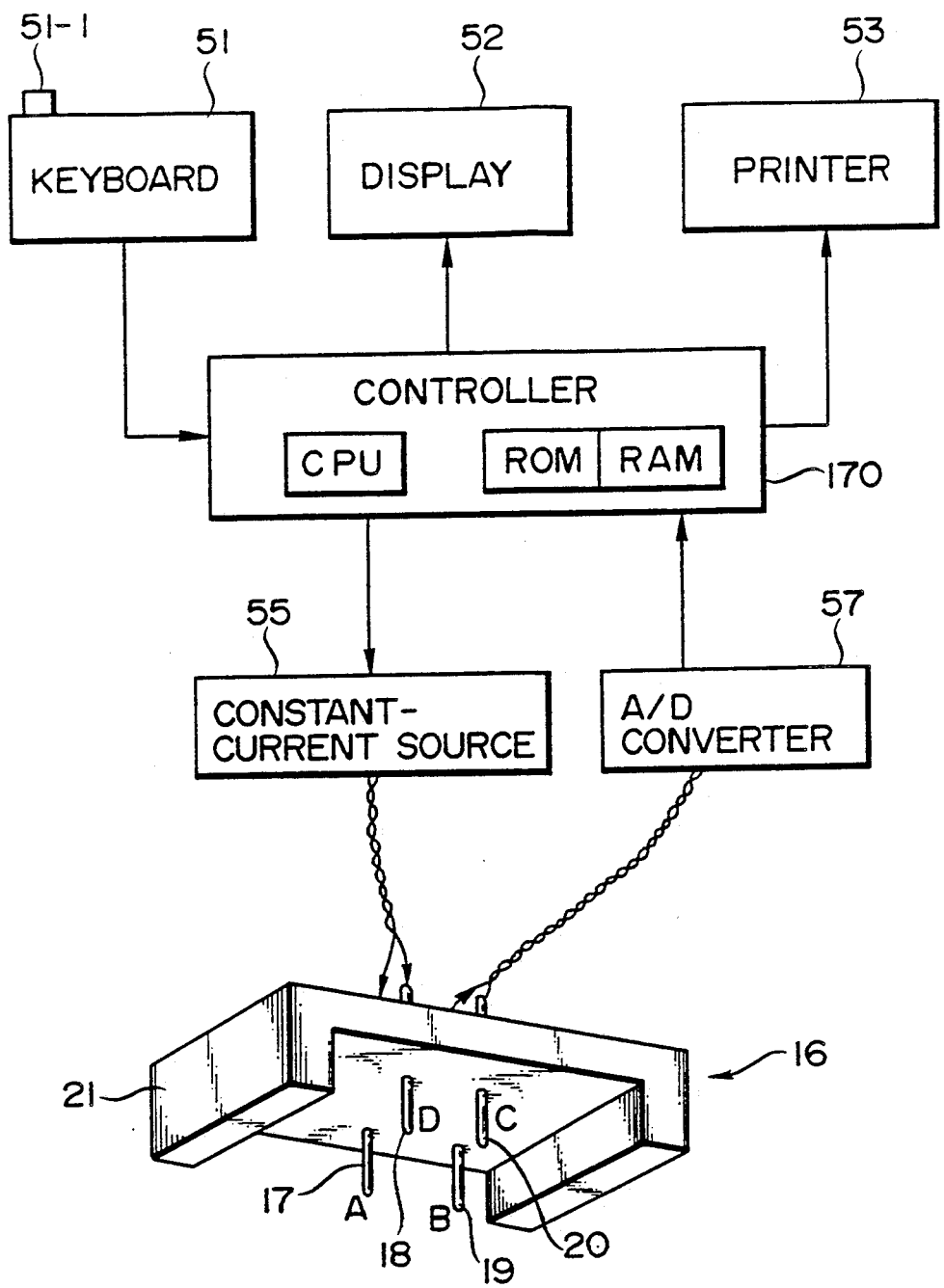
FIG. 17 is a block diagram illustrating the simplified construction of a resistivity measuring apparatus in another embodiment of the invention.

FIG. 17 is a block diagram illustrating the general construction of another embodiment of a resistivity measuring apparatus according to the present invention.

The apparatus includes the keyboard 51 for inputting shape information such as the dimensions and thickness of a sample to be measured, and position information for positioning a strobe array 16 relative to the sample, the display unit 52, such as a CRT or liquid crystal, for displaying the results obtained by computing the correction coefficient of the sample, as well as the surface resistivity and volume resistivity of the sample, and the printer 53 which, in response to a command from a controller 170 whenever required, prints out various results displayed on the display unit 52.

The controller 170 is for overall control of the resistivity measuring apparatus and includes e.g. a CPU such as a microprocessor, an LSI for various operations, a ROM storing the CPU control program and various data, and a RAM serving as a working memory of the CPU for temporarily preserving various data. The controller 170 is adapted to compute the correction coefficient (F) based on data such as the inputted shape of the sample, energize two predetermined electrodes of the probe array 16, detect the surface potential of the sample by using the other two electrodes, and calculate the surface resistivity and volume resistivity of the sample.

The apparatus is also provided with the constant-current source 55 for passing a predetermined constant current through probes 17 (A) and 18(B) of the probe array 16, and the A/D converter 57, the input of which is an analog voltage produced across probes 19(B) and 20(C), for converting this analog voltage value into a digital signal outputted to the controller 170. The probe array 16 has a holder 21 made of an electrical insulator. The four probes 17 through 20 are arranged in the holder 21 in a generally square pattern. The probes 17–20 are spring-contact probes (electrodes) adapted to contact the surface of the sample at a constant pressure. It should be noted that the tips of the probes 17, 18 through which the current is passed are somewhat rounded in order to reduce the contact resistance with the sample surface. The same is true for the abovementioned probes 11 and 14.

The manner in which a correction coefficient is determined using the probe array 16 of FIG. 17 will now be described.

In general, electric potential E is expressed by the equation $E = R \cdot I$, in which R and I represent resistance and current values, respectively. Accordingly surface resistivity $\rho_S$ is determined by the equation $\rho_S = F \times R\Omega/\square$ (where F is the correction coefficient). Volume resistivity $\rho_V$ can be obtained in accordance with the equation $\rho_V = F \times R \times t$ (where t represents the thickness of the sample).

Figure 18:
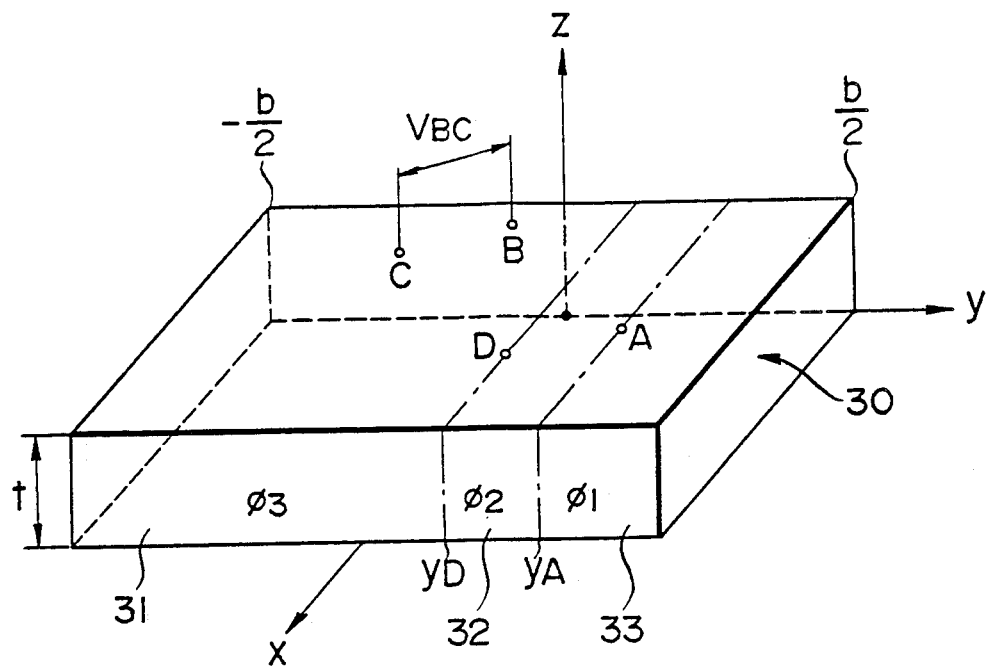
FIG. 18 is a view for describing the principle of determining a correction coefficient of a sample by a four-point probe method in another embodiment of the invention.
Figure 20:
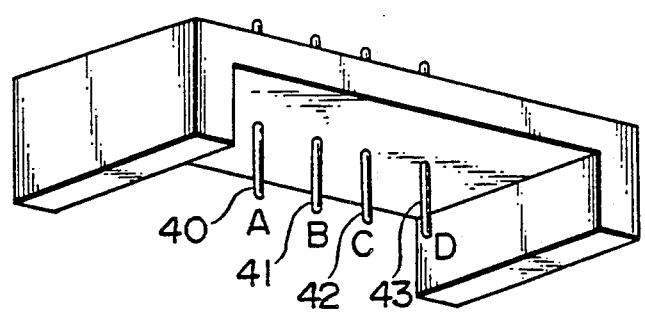
FIG. 20 is a view illustrating the configuration of a four-point probe arrangement according to the prior art.

FIG. 18 is a view showing resistivity measurement of a rectangular sample 30 using the four-point probe 16 illustrative of another embodiment.

A coordinate system is set up as shown in FIG. 18, with the origin of the coordinate system being indicated at numeral 34. A through D represent the points at which the respective probes 17–20 of the probe array 16 shown in FIG. 17 contact the surface of a sample 30. Let $y_A$ represent the y coordinate of contact point A, and $y_D$ the y coordinate of contact point D. Also, let region 31 represent a range in which the y coordinate satisfies the relation $-b/2 \leq y \leq y_D$, region 32 a range in which the y coordinate satisfies the relation $y_D \leq y \leq y_A$, and region 33 a range in which the y coordinate satisfies the relation $y_A \leq y \leq b/2$.

If $V_{BC}$ represents a potential difference produced across the probes 19(B), 20(C) when a current $I_{AD}$ is passed through the probes 17(A), 18(D) then the resistivity $\rho$ of the sample 30 will be expressed by the equation $\rho = F_\rho(t \cdot V_{BC}/I_{AB})$. Here F is a coefficient dependent upon the shape of the sample 30 and the position at which the probe array 16 is placed, and is referred to as a resistivity correction coefficient Letting the potential at region 31 be expressed by $\phi_3(\vec{r})$, the potential difference $V_{BC}$ can be obtained from $V_{BC}=\phi_3(\vec{r}_B)-\phi_3(\vec{r}_C)$. Here $\phi_3(\vec{r}_C)$ is a solution, in the region 31, to Poisson's equation $\nabla^2\phi(\vec{r})=2\rho I_{AD}\{\delta(\vec{r}-\vec{r}_D)-\delta\vec{r}-\vec{r}_A)\ \}$. Therefore, the reciprocal $F_P^{-1}$ of the correction coefficient $F_P$ in FIG. 18 can be expressed as shown hereinbelow. Note that $\xi=m\pi/a$, $\eta=p\pi/t$ and $\zeta=(\xi^2+\eta^2)^{\frac{1}{2}}$ hold.

$$F_P^{-1} = \sum_{m=1}^{\infty} \frac{2}{a\xi \cdot \sinh b\xi} \times$$

$$\left\{\cos\xi X_A \cosh\xi\left(y_A - \frac{b}{2}\right) - \cos\xi X_D \cosh\xi\left(y_D - \frac{b}{2}\right)\right\}\times$$

$$\left\{\cos\xi X_B \cosh\xi\left(y_A - \frac{b}{2}\right) - \cos\xi X_C \cosh\xi\left(y_C - \frac{b}{2}\right)\right\}+$$

$$\sum_{P=i}^{\infty} \frac{2}{a\eta \sinh b\eta}\left\{\cosh\eta\left(y_A - \frac{b}{2}\right) - \cosh\eta\left(y_D - \frac{b}{2}\right)\right\}\times$$

$$\left\{\cosh\eta\left(y_B + \frac{b}{2}\right) - \cosh\eta\left(y_C + \frac{b}{2}\right)\right\}+$$

$$\sum_{m=1}^{\infty}\sum_{P=1}^{\infty} \frac{4}{a\zeta \sinh b\zeta} \times$$

$$\left\{\cos\xi X_A \cosh\zeta\left(y_A - \frac{b}{2}\right) - \cos\xi X_D \cosh\zeta\left(y_D - \frac{b}{2}\right)\right\}\times$$

$$\left\{\cos\xi X_B \cosh\zeta\left(y_B - \frac{b}{2}\right) - \cos\xi X_C \cosh\zeta\left(y_C - \frac{b}{2}\right)\right\}$$

A composition routine is prepared based on the foregoing equation, the reciprocal $F_P^{-1}$ of the correction coefficient is calculated, with computation being halted when e.g. the computed term is less than a predetermined value, and the correction coefficient is obtained from $1/F_P^{-1}$.

Figure 19:
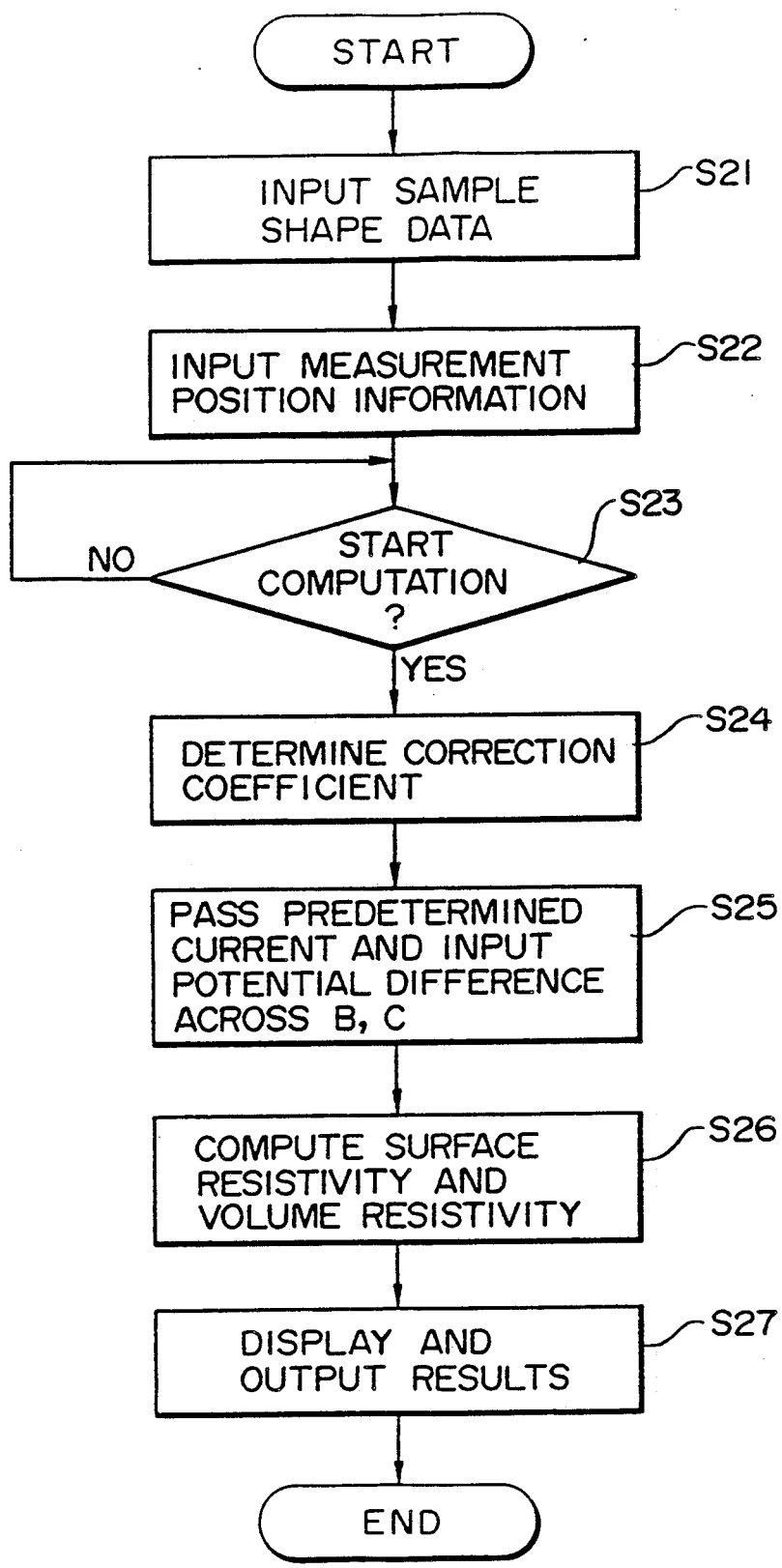
FIG. 19 is a flowchart illustrating resistivity measurement processing in a measuring device according to another embodiment.

FIG. 19 is a flowchart illustrating the resistivity measuring operation performed by the resistivity measuring device of this embodiment.

Sample shape information such as the longitudinal and transverse lengths of the sample and the thickness of the smaple are inputted from the keyboard 51 and stored in the RAM at a step S21. Next, the measurement position of the probe array 16 on the sample is inputted from the keyboard 51 and stored in the RAM at a step S22. The purpose of this step is to designate the (x,y) coordinates of a point on the sample at which the center of the four-point probe array 16 is to be situated. It is determined at step S23 whether start of computation of the correction coefficient $F_P$ has been designated by pressing a start key 51-1 on the keyboard 51.

When the start of computation has been designated, the program proceeds to a step S24 at which the correction coefficient is computed in accordance with the computation formula described above with reference to FIG. 18. This computation can be executed entirely by program or by hardware using the computation LSI or the like.

When the correction coefficient $F_P$ has been computed for the sample, the results are stored in the RAM and the program proceeds to a step S25. Here the constant-current source 55 is driven into operation to pass the predetermined constant current ($I_{AD}$) through the probes 17(A), 18(D), and the potential produced across the probes 19(B), 20(C) is converted into a digital value ($V_{BC}$) by the A/D converter 57. This value is inputted to the controller 170.

The surface resistivity $\rho_S$ and the volume resistivity $\rho_V$ are computed at a step S26. The computation formulae are written as follows:

$$\rho_S = F_P \cdot V_{BC}/I_{AD}\Omega/\square$$

$$\rho_V = F_P \cdot t \cdot V_{BC}/I_{AD}\Omega \cdot cm$$

The correction coefficient, the surface resistivity, the volume resistivity and the like are displayed on the display unit 52 at a step S27. If a print command is inputted from the keyboard 51, the computed results are delivered to the printer 53 to be printed out thereby.

In the foregoing embodiment, the probes are arrayed in the approximate form of a square. However, the invention is not limited to this embodiment. As long as all four of the probes are not arrayed on the same straight line and the two probes B, C are not equally distanced from the probe A and the probe B, it will suffice if the probe arrangement is such that a potential difference is produced across the probes B, C. Furthermore, the functions of the probes can be changed if desired. For example, the current can be passed through the probes B, C and the potential produced across the probes A, D can be detected.

In this embodiment, it is permissible to designate the probe array position by using the X-Y table 54, as described above in connection with FIG. 13. Also, as described above in the first embodiment, a limit switch can be provided for protecting the sample by limiting the current impressed upon the sampe by the constant-current source 55.

In accordance with the resistivity measuring device of this embodiment as described above, the correction coefficient, surface resistivity and volume resistivity even of a small sample can be determined.

Furthermore, in accordance with the measurement probe of this embodiment, the probe array can be placed even on a sample of small size. This makes it possible to measure samples which could not be measured in the prior art. By employing a resistivity correction coefficient which corresponds to the probe array information, measurement becomes possible using a four-point probe which conforms to the shape of the sample.

Thus, in accordance with the present invention as described above, a four-point probe can be placed even on a sample having a small size, so that such resistivity as the surface resistivity and volume resistivity of the sample can be determined.

With the measurement probe of the invention, the resistivity of a sample can be measured using a probe conforming to the shape of the sample.

Figure 22:
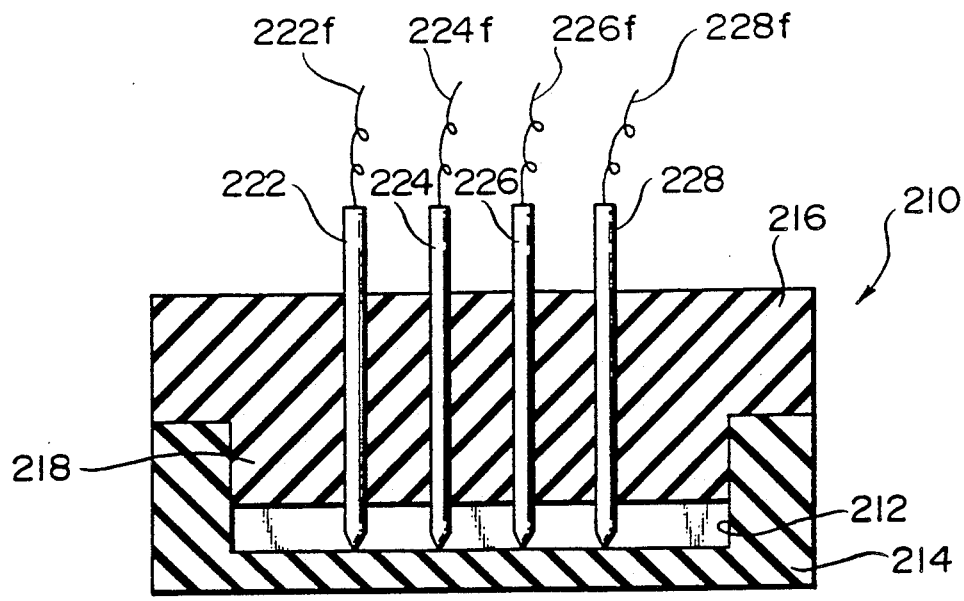
FIG. 22 is a sectional view illustrating a base and a holder fitted together in the probe for the resistance measuring device of the embodiment.
Figure 23:
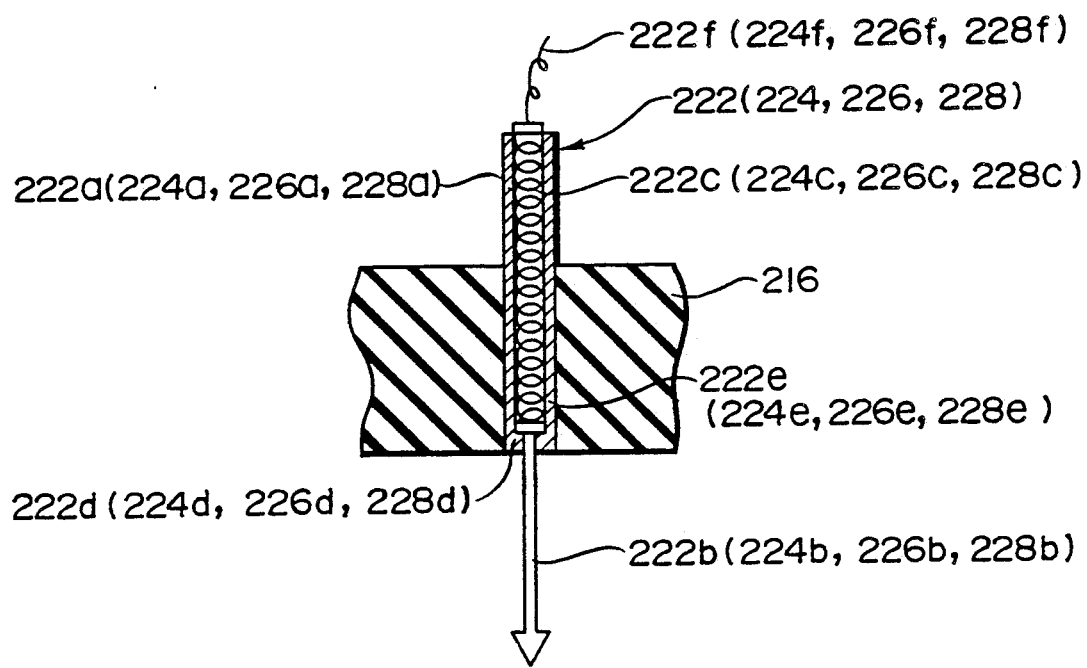
FIG. 23 is a front view illustrating the construction of a spring contact electrode.

Next, the construction of an embodiment of a probe for a resistivity measuring device in accordance with the invention will be described in detail with reference to FIGS. 21 through 23. Though the embodiment relates to a probe array in which four probes (electrodes) are arrayed in a straight line, the invention is also applicable to electrodes arrayed in rectangular form, as in the above-described embodiment.

Figure 21:
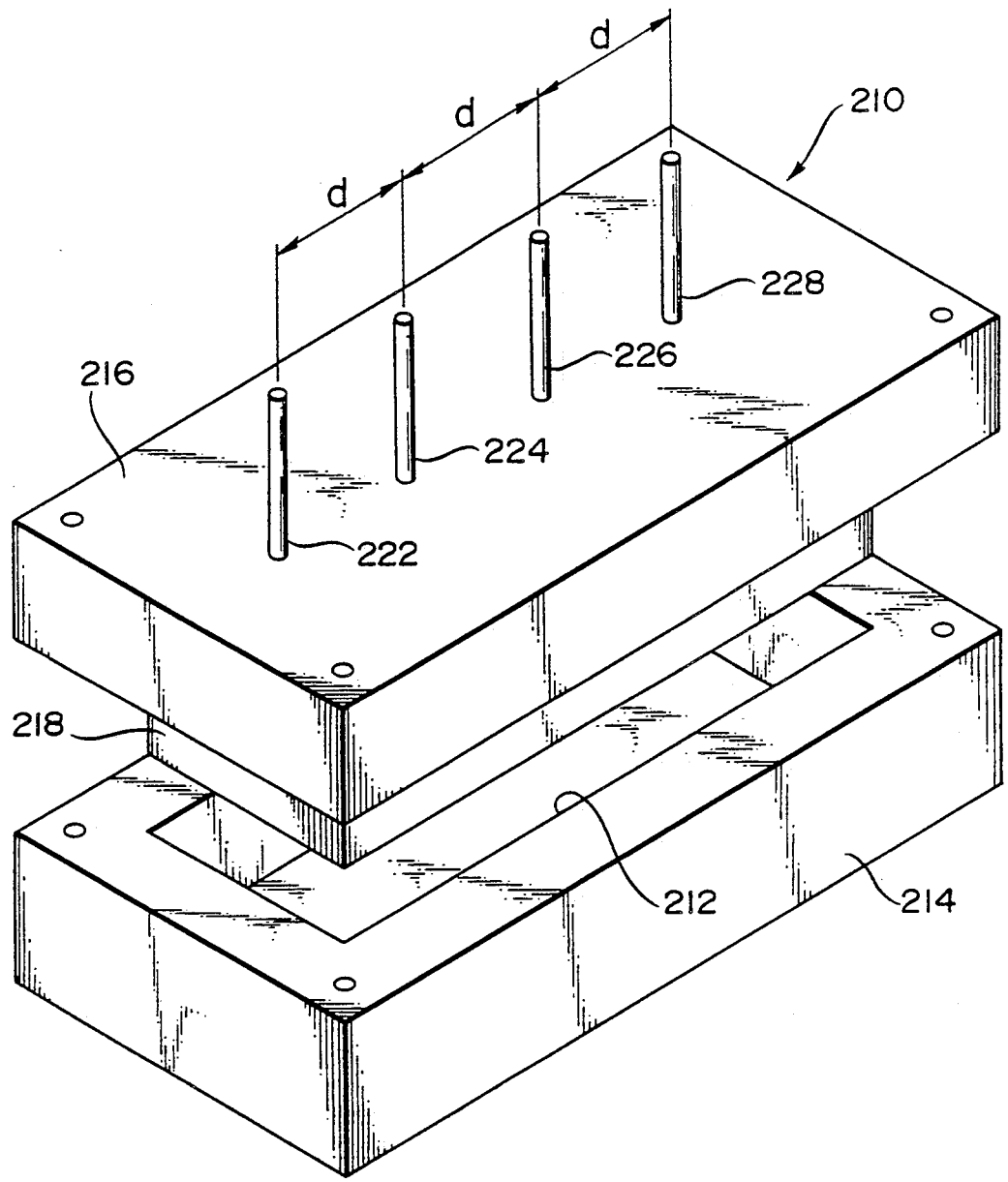
FIG. 21 is a perspective view illustrating the construction of an embodiment of a probe for a resistivity measuring device according to an embodiment of the invention.

In FIG. 21, the probe for a resistivity measuring device is shown at numeral 210. The probe 210 includes a base 214 having the shape of a rectangular prism and formed from an electrical insulator. One side of the base 214 is formed to include a rectangular recess 212 for accommodating a sample to be measured. The electrical insulator comprises a member consisting of a synthetic resin or some other electrically insulative material. The recess 212 is formed at substantially the center of the top side of the base 214 and has a bottom surface defining a face on which a sheet-like sample is placed.

The probe 210 further includes a holder 216 which, like the base 214, has the shape of a rectangular prism and formed from an electrical insulator. The surface (lower surface) of the holder 216 opposite the top surface of the base 214 is formed to include a projection 218 which matches the shape of the recess 212 in base 214 so as to fit into the recess. More specifically, the projection 218 defines a rectanglar form whose outer side surfaces come into sliding contact with the corresponding inner side surfaces of the recess 212. As shown in FIG. 22, the downwardly protruding surface of the projection 218 and the bottom surface of the recess 212 are so designed as to be spaced apart a predetermined distance when the holder 216 has been fitted into the base 214.

When the holder 216 has been fitted into the base 214, the inner side surfaces of the recess 212 of base 214 and the corresponding outer side surfaces of the projection 218 of holder 216 are is sliding contact with each other. As a result, the space inside the recess 212 is sealed off and lateral looseness is positively prevented. This assures that the holder and base are maintained fitted together in excellent fashion. In such state the peripheral portion of the lower face of holder 216 is in abutting contact with the peripheral portion of the upper face of base 214, as a result of which distance between the protruding face of projection 218 and the bottom surface of recess 212 can be held constant.

As shown in FIG. 21, four equidistant spring-contact electrodes 222, 224, 226 and 228 are provided colinearly in the holder 216 with their upper and lower ends projecting vertically from the upper and lower surfaces, respectively, of the holder 216. The spring-contact electrodes 222, 224, 226, 228 respectively comprise sleeves 222a, 224a, 226a, 228a vertically embedded in the holder 216, electrode bodies 222b, 224b, 226b, 228b provided in the sleeves 222a, 224a, 226a, 228a so as to be capable of sliding up and down, and coil springs 222c, 224c, 226c, 228c arranged in the sleeves 222a, 224a, 226a, 228a for downwardly biasing the corresponding electrode bodies 222b, 224b, 226b, 228b.

The electrode bodies 222b, 224b, 226b, 228b and the corresponding coil springs 222c, 224c, 226c, 228c are electrically connected to each other.

The lower ends of the sleeves 222a, 224a, 226a, 228a are formed to have inner flanges 222d, 224d, 226d, 228d, respectively, and the upper ends of the electrode bodies 222b, 224b, 226b, 228b are formed to have outer flanges 222e, 224e, 226e, 228e engageable with the corresponding inner flanges 222d, 224d, 226d, 228d. By engaging the inner flanges 222d, 224d, 226d, 228d and the outer flanges 222e, 224e, 226e, 228e, the electrode bodies 222b, 224b, 226b, 228b are prevented from dropping out and the amount of their downward projection is limited so as not to exceed that which prevails when the inner and outer flanges are engaged.

The lower end of each of the electrode bodies 222b, 224b, 226b, 228b is formed into an inverted circular cone the tip of which is designed to contact the sample surface over a predetermined, constant small area of pin-point size.

In this embodiment, the spring-contact electrodes 222, 224, 226, 228 are set to have a spacing d of 0.05–1.0 cm, preferably 0.5 cm. The amount of downward projection of the electrodes in a state where no external force is acting upon the electrode bodies 222b, 224b, 226b, 228b is set at 0.5–5.0 mm.

The spring constants of the coil springs 222c, 224c, 226c, 228c should be as large as possible. The value is no less than 10 g per coil spring, preferably no less than 100 g.

The upper ends of the coil springs 222c, 224c, 226c, 228c are electrically connected to the abovementioned constant-current source and A/D converter via conductors 222f, 224f, 226f, 228f, respectively. More specifically, the conductors 222f, 228f connected to the outer coil springs 222c, 228c are connected to the constant-current source 55, and the conductors 224f, 226f connected to the inner coil springs 224c, 226c are connected to the A/D converter 57.

Measurement of the surface resistivity of a sheet-like sample using the probe 210 for the resistivity measuring device constructed as set forth above will now be described.

First, the sample is formed into a shape capable of being accommodated within the recess 212 of the base 214. Such a sample is then placed on the bottom surface of the recess 212. After the sample has thus been disposed in the base 214, the holder 216 is attached to the base 214 in such a manner that the projection 218 is fitted into the recess 212 of the base. The holder 216 is secured to the base 214 as by screws.

By thus attaching the holder 216 to the base 214, the inner surfaces of the recess 212 of base 214 and the corresponding outer surfaces of the projection 218 of holder 216 are brought into sliding contact with each other, as described above. As a result, movement in a plane, namely looseness in the transverse direction, is reliably prevented. Furthermore, by bringing the peripheral portion of the lower face of holder 216 into abutting contact with the peripheral portion of the upper face of base 214, the distance between the protruding face of projection 218 and the bottom surface of recess 212 can be held constant. The positional relation between the base 214 and holder 216 is thus set in an accurate manner.

In accordance with the operation for fitting the base 214 and holder 216 together, the tips of the four spring-contact electrodes 222, 224, 226, 228 come into contact with the surface of the sample before the peripheral portion on the lower face of holder 216 abuts against the peripheral portion of the upper face of base 214. Thereafter, the spring-contact electrodes 222, 224, 226, 228 are urged upward against the biasing forces of the corresponding coil springs 222c, 224c, 226c, 228c until the peripheral portion on the lower face of holder 216 abuts against the peripheral portion of the upper face of base 214.

As a result, the four spring-contact electrodes 222, 24, 226, 228 abut against the sample, which has been placed on the bottom surface of the recess 212, at a constant pressure and constant angle at all times. By thus using probe 210, the sample can always be measured in a constant attitude, so that the same measurement results can be obtained even if the same sample is measured repeatedly a number of times. This makes it possible to improve the reliability of measured values.

In accordance with this embodiment, the sample is sealed within the probe 210 for the resistivity measuring device. This makes it possible to accurately measure the temperature dependence of sample resistivity as by disposing the probe 210 in an isothermic bath and varying the temperature of the bath from a predetermined low temperature to a predetermined high temperature. In other words, in the prior art, a sample to be measured is set in a state exposed to the atmosphere, thus making it difficult to hold the sample at a constant, predetermined temperature. As a result, it is almost impossible to measure the temperature dependence of the sample surface resistivity. In accordance with the present invention, however, the sample is sealed within the probe 210 at the time of measurement so that the temperature dependence of the sample resistivity can be measured.

The invention is not limited to the construction of the above-described embodiment but can be modified in various ways within the scope of the claims.

For example, it is described in the foregoing embodiment that the recess 212 of base 214 is rectangular in shape, and that the base 214 itself has the shape of a rectangular prism. However, the invention is not limited to this arrangement. For example, an arrangement can be adopted in which the base is formed from a cylindrical body and the recess is defined as a columnar space within the base.

Further, if it is desired to set a rapid cooling rate, cut-outs or through-holes can be provided in the side wall of the base 214 so that a cooling medium may come into direct contact with the sample.

Thus, as described in detail hereinabove, a probe for a resistivity measuring device is characterized by comprising a base consisting of an electrical insulator, one side of the base being formed to include a recess for accommodating a sample to be measured, a holder one side of which has a projection formed so as to fit into the recess formed in the base, and a plurality of contact probes upstandingly provided on the surface of the projection so as to contact the surface of the sample accommodated in the recess in a state where the holder and the base are united by fitting the projection and the recess together.

In accordance with the present invention, therefore, the sample can always be measured in a constant attitude, so that the same measurement results can be obtained even if the same sample is measured repeatedly a number of times. This makes it possible to improve the reliability of measured values. It is also possible to measure the temperature dependence of the sample resistance.

As many apparently widely different embodiments of the present invention can be made without departing from the spirit and scope of thereof, it is to be understood that the invention is not limited to the specific embodiments thereof except as defined in the appended claims.

What is claimed is:

1. Apparatus for measuring surface resistivity of a sample with a four-point probe, comprising:
a four-point probe having four electrodes to contact with said sample, two outer electrodes of said four electrodes to be contacted on said sample for passing a predetermined current (I) and two inner electrodes of said four electrodes for detecting a potential difference (V) produced by said current;
input means for inputting (i) shape information specifying whether said sample is rectangular or circular, (ii) information specifying dimensions and thickness (t) of said sample, and (iii) information indicating a measurement position of said four-point probe on said sample;
a ROM arranged for memorizing calculation procedures of first and second correction coefficients using each of a first equation which is $$F^{-1} = \frac{y_B - y_C}{a} +$$

$$\sum_{m=1}^{\infty} \{G(\xi, x_A, x_B, x_C, y_A, y_B, y_C) -$$

$$G(\xi, x_D, x_B, x_C, -y_D, -y_B, -y_C)\} +$$

$$\sum_{n=1}^{\infty} \{G, (\eta, 0, 0, 0, y_A, y_B, y_C) -$$

$$G(\eta, 0, 0, 0, -y_D, -y_B, -y_C)\} +$$

$$\sum_{m=1}^{\infty} \sum_{n=1}^{\infty} 2\{(\zeta, x_A, x_B, x_C, y_A, y_B, y_C)\} -$$

$$G(\zeta, x_D, x_B, x_C, -y_D, -y_B, -y_C)\}$$

wherein $G(P, Q, R, S, T, U, V) =$ $$\frac{2}{aP \sinh (bP)} \cos(\xi Q) \cosh P\left(\frac{b}{2} - T\right) \times$$

$$\left\{\cos(\xi R) \cosh P\left(\frac{b}{2} + U\right) - \right.$$

$$\left. \cos(\xi S) \cosh P\left(\frac{b}{2} + V\right)\right\}, \xi = \frac{m\pi}{a}, \eta =$$

$$\frac{n\pi}{t}, \zeta = (\xi^2 + \eta^2)^{\frac{1}{2}},$$

wherein each of the coordinates $(x_A, y_A)$, $(x_B, y_B)$, $(x_C, y_C)$, $(x_D, y_D)$ represents a position of a corresponding one of the four electrodes respectively (a,b are dimensions of a rectangular sample), and a second equation which is $$F^{-1} = \frac{t}{2\pi} \left\{ \frac{1}{d_{AB}} + \frac{1}{d_{BA'}} - \frac{1}{d_{BD}} - \frac{1}{d_{BD'}} - \right.$$

$$\frac{1}{d_{AC}} - \frac{1}{d_{CA'}} + \frac{1}{d_{CD}} + \frac{1}{d_{CD'}} + f(d_{AB}) + f(d_{BA'}) -$$

$$\left. f(d_{BD}) - f(d_{BD'}) - f(d_{AC}) - f(d_{CA'}) + f(d_{CD}) + f(d_{CD'}) \right\}$$

wherein, $f(x) = \sum_{n=1}^{\infty} \frac{2}{\sqrt{x^2 + (2nt)^2}}$ $$d_{AB} = \sqrt{(x_A - x_B)^2 + (y_A - y_B)^2}$$

$$d_{BA} = \sqrt{(x_A - x_B)^2 + (y_A - y_B)^2}$$

-continued $$d_{BD} = \sqrt{(x_B - x_D)^2 + (y_B - y_D)^2}$$

$$d_{AC} = \sqrt{(x_A - x_C)^2 + (y_A - y_C)^2}$$

$$d_{CA} = \sqrt{(x_A - x_C)^2 + (y_A - y_C)^2}$$

$$d_{CD} = \sqrt{(x_C - x_D)^2 + (y_C - y_D)^2}$$

$$d_{BA'} = \sqrt{(x_{A'} - x_B)^2 + (y_{A'} - y_B)^2}$$

$$d_{BD'} = \sqrt{(x_B - x_{D'})^2 + (y_B - y_{D'})^2}$$

$$d_{CA'} = \sqrt{(x_{A'} - x_C)^2 + (y_{A'} - y_C)^2}$$

$$d_{CD'} = \sqrt{(x_C - x_{D'})^2 + (y_C - y_{D'})^2}$$

$$x_{A'} = a^2 \times x_A/(x_A^2 + y_A^2)$$

$$y_{A'} = a^2 \times y_A/(x_A^2 + y_A^2)$$

$$x_{D'} = a^2 \times x_D/(x_D^2 + y_D^2)$$

$$y_{D'} = a^2 \times y_D/(x_D^2 + y_D^2)$$

wherein ("a" is a radius of a circular sample, each of the coordinates $(x_A,y_A)$, $(x_B,y_B)$, $(x_C,y_C)$, $(x_D,y_D)$ represents a position of a corresponding one of the four electrodes respectively;

resistance calculating means for calculating a resistance value (V/I) from a predetermined value of a current (I) and a potential difference (V);

a processor arranged for selecting one of said calculation procedures according to said shape information, and for calculating either said first or said second correction coefficient for said sample based on said dimensions, said thickness and said measurement position using the selected calculation procedure, and for calculating surface resistivity of said sample using an equation (F×V/I), wherein said F is said first or said second correction coefficient and V/I is said resistance value; and output means for outputting said surface resistivity and said first or second correction coefficient as calculated by said processor.

2. The apparatus according to claim 1, further comprising:

supporting means for fixedly retaining said sample and for movably supporting said four point probe over said sample at a fixed angle of said four-point probe relative to said sample;

driving means for driving said supporting means to move said four point probe to said measurement position designated by said input means; and means for contacting four electrodes of said four point probe to said sample when said probe has been moved to said measurement position by said driving means.

3. The apparatus according to claim 1, wherein said processor means further comprises:

calculating means for calculating volume resistivity of said sample using an equation (F×t×V/I).

4. The apparatus according to claim 1, wherein said four-point measurement probe comprises:

a base comprising an electrical insulator, one side of said base being formed to include a recess for accommodating therein said sample to be measured;

a holder one side of which has a projection thereon so as to fit into said recess of said base; and four contact electrodes provided on said holder for contacting a surface of said sample in a state where said holder and said base are united by fitting said projection and said recess together.

5. The apparatus according to claim 4, wherein said four contact electrodes are mounted so as to be contactable with said projection, and are biased away from a surface of said projection toward said sample by biasing members.

6. A resistivity measurement apparatus for measuring surface resistivity of a rectangular sample by bringing four electrodes into contact with the rectangular sample, comprising:

a measurement probe having two energizing electrodes for passing a current (I) through said rectangular sample, and two voltage measuring electrodes for measuring a surface potential difference (V) of said rectangular sample produced by said current (I), said energizing electrodes and said voltage measuring electrodes being arranged in a generally square pattern;

input means for inputting size information specifying dimensions and thickness (t) of said rectangular sample, and measurement position information of said measurement probe on said sample;

a ROM arranged for memorizing calculation procedures of a correction coefficient ($F_p$) using the equation $$F_p^{-1} = \sum_{m=1}^{\infty} \frac{2}{a\xi \cdot \sinh b\xi} \times$$

$$\left\{ \cos\xi x_A \cosh\xi \left( y_A - \frac{b}{2} \right) - \cos\xi x_D \cosh\xi \left( y_D - \frac{b}{2} \right) \right\} \times$$

$$\left\{ \cos\xi x_B \cosh\xi \left( y_B - \frac{b}{2} \right) - \cos\xi x_C \cosh\xi \left( y_C - \frac{b}{2} \right) \right\} +$$

$$\sum_{P=i}^{\infty} \frac{2}{a\eta \sinh b\eta} \left\{ \cosh\eta \left( y_A - \frac{b}{2} \right) - \cosh\eta \left( y_D - \frac{b}{2} \right) \right\} \times$$

$$\left\{ \cosh\eta \left( y_B + \frac{b}{2} \right) - \cosh\eta \left( y_C + \frac{b}{2} \right) \right\} +$$

$$\sum_{m=1}^{\infty} \sum_{P=1}^{\infty} \frac{4}{a\zeta \times \sinh b\zeta} \times$$

$$\left\{ \cos\xi x_A \cosh\zeta \left( y_A - \frac{b}{2} \right) - \cos\xi x_D \cosh\zeta \left( y_D - \frac{b}{2} \right) \right\} \times$$

$$\left\{ \cos\xi x_B \cosh\zeta \left( y_B - \frac{b}{2} \right) - \cos\xi x_C \cosh\zeta \left( y_C - \frac{b}{2} \right) \right\}$$

wherein $a,b$ are dimensions of sample, and $\xi = \frac{m\pi}{a}$, $$\eta = \frac{p\pi}{t}, \zeta = \sqrt{\xi^2 + \eta^2} \ ;$$

a processor for calculating said correction coefficient ($F_p$) of said sample based on said size information and said measurement position using said equation, and for calculating a resistance value (V/I) using said current value (I) and said surface potential difference (V), and for calculating surface resistivity of said sample using an equation ($F_p \times V/I$) and volume resistivity of said sample using an equation ($F_p \times t \times V/I$); and output means for outputting said surface resistivity and said volume resistivity as calculated by said processor.

7. The apparatus according to claim 6, further comprising:

supporting means for fixedly retaining said sample and for movably supporting said measurement probe over said sample at a fixed angle of said four-point probe relative to said sample;

driving means for driving said supporting means to move said measurement probe to said measurement position designated by said input means; and means for contacting four electrodes of said measurement probe to said sample when said measurement probe has been moved to said measurement position by said driving means.

* * * * *